(12) United States Patent
Lu et al.

(10) Patent No.: US 10,116,419 B2
(45) Date of Patent: Oct. 30, 2018

(54) METHOD AND APPARATUS FOR DETERMINING FORWARD ERROR CORRECTION FRAME BOUNDARY, AND DECODING SYSTEM

(71) Applicant: Huawei Technologies Co., Ltd., Shenzhen (CN)

(72) Inventors: Yuchun Lu, Beijing (CN); Liang Li, Beijing (CN); Suping Zhai, Beijing (CN); Dajun Zang, Beijing (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/411,669

(22) Filed: Jan. 20, 2017

(65) Prior Publication Data

US 2017/0134121 A1  May 11, 2017

Related U.S. Application Data

(63) Continuation of application No. PCT/CN2014/082660, filed on Jul. 22, 2014.

(51) Int. Cl.
  *H03M 13/00* (2006.01)
  *H04L 1/00* (2006.01)
  (Continued)

(52) U.S. Cl.
  CPC ........ *H04L 1/0083* (2013.01); *H03M 13/333* (2013.01); *H03M 13/3746* (2013.01);
  (Continued)

(58) Field of Classification Search
  CPC .......................... H04L 1/0083; H03M 13/3746
  See application file for complete search history.

(56) References Cited

U.S. PATENT DOCUMENTS 5,638,384 A * 6/1997 Hayashi ............... H04L 1/0007
                                                        714/752
5,673,296 A * 9/1997 Ohgane ................. H04J 3/0608
                                                        370/512
(Continued)

FOREIGN PATENT DOCUMENTS

| CN | 101997628 A | 3/2011 |
|----|-------------|--------|
| CN | 102263609 A | 11/2011 |
| EP | 2034657 A1 | 3/2009 |

OTHER PUBLICATIONS

Hitek Systems LLC, "IEEE 802.3 Clause 74 FEC IP Core Product Brief (HTK-CLAUSE74-FEC)", Revision 1.2, Oct. 8, 2013, 4 pages.

(Continued)

*Primary Examiner* — Esaw T Abraham
(74) *Attorney, Agent, or Firm* — Slater Matsil, LLP

(57) ABSTRACT

The present embodiments provide a method and an apparatus for determining a frame boundary of an FEC frame, and a decoding system. The method includes receiving data, where the data includes N+P consecutive symbols, N consecutive symbols constitute a first data block, and N consecutive symbols constitute a second data block; obtaining s parameter values corresponding to the first data block. The method also includes determining a first iterative item and a second iterative item and determining, according to the s parameter values corresponding to the first data block, s parameter values corresponding to the second data block. Additionally, the method includes determining, according to the s parameter values corresponding to the second data block, whether the second symbol is a frame boundary of an FEC frame.

20 Claims, 7 Drawing Sheets

(51) Int. Cl.
*H03M 13/37* (2006.01)
*H03M 13/33* (2006.01)
*H04L 7/04* (2006.01)

(52) U.S. Cl.
CPC ............ *H04L 1/00* (2013.01); *H04L 7/048* (2013.01); *H05K 999/99* (2013.01)

(56) References Cited

U.S. PATENT DOCUMENTS

| | | | | |
|---|---|---|---|---|
| 7,050,373 | B2 * | 5/2006 | Tonami | G11B 20/1403 369/275.1 |
| 8,208,499 | B2 * | 6/2012 | Sun | H04L 1/0057 370/278 |
| 8,495,478 | B2 * | 7/2013 | Liu | H03M 13/333 714/781 |
| 8,667,373 | B2 * | 3/2014 | He | H03M 13/159 714/752 |
| 8,719,674 | B2 * | 5/2014 | Takahashi | H04L 7/048 714/775 |
| 8,756,483 | B2 * | 6/2014 | Kim | H03M 13/1515 714/776 |
| 8,769,368 | B2 * | 7/2014 | He | H04L 7/048 370/514 |
| 9,705,723 | B2 * | 7/2017 | Kim | H04L 27/2602 |
| 2010/0070839 | A1 | 3/2010 | Shigihara et al. | |
| 2011/0078545 | A1 | 3/2011 | He et al. | |
| 2011/0296282 | A1 | 12/2011 | Liu et al. | |

OTHER PUBLICATIONS

IEEE Computer Society, "Draft Standard for Ethernet Amendment X: Physical Layer Specifications and Management Parameters for 100 Gb/s Operation Over Backplanes and Copper Cables", IEEE P802.3bj/D2.3, Oct. 11, 2013, 356 pages.

IEEE Computer Society, "IEEE Standard for Ethernet Amendment 2: Physical Layer Specifications and Management Parameters for 100 Gb/s Operation Over Backplanes and Copper Cables", IEEE Std 802.3bj, Jun. 12, 2014, 368 pages.

ITU-T, "Recommendation ITU-T G.709/Y.1331—Amendment 2 Series G: Transmission Systems and Media, Digital Systems and Networks, Series Y: Global Information Infrastructure, Internet Protocol Aspects and Next-Generation Networks", Geneva, Switzerland, Oct. 2013, 14 pages.

* cited by examiner

METHOD AND APPARATUS FOR DETERMINING FORWARD ERROR CORRECTION FRAME BOUNDARY, AND DECODING SYSTEM

CROSS-REFERENCE TO RELATED APPLICATIONS

This application is a continuation of International Application No. PCT/CN2014/082660, filed on Jul. 22, 2014, the disclosure of which is hereby incorporated by reference in its entirety.

TECHNICAL FIELD

Embodiments relate to the communications field, and more specifically, to a method and an apparatus for determining a forward error correction frame boundary, and a decoding system.

BACKGROUND

As a rate of a high-speed communication link continuously increases, various damage effects of a channel are gradually strengthened, which causes a signal-to-noise ratio to decrease. To improve bit error performance in the case of a low signal-to-noise ratio, a forward error correction (FEC) technology has gradually become a mandatory technology during a process of implementing a high-speed communication link. Among numerous FEC codes, a Reed Solomon (RS) code and a Bose-Chaudhuri-Hocquenghem (BCH) code are widely applied due to advantages such as a high gain, easy implementation, and a small quantity of occupied resources. The RS code has been adopted by G.709 of the International Telecommunication Union-Telecommunication Standardization Sector (ITU-T) and 802.3bj of the Institute of Electrical and Electronic Engineers (IEEE). The BCH code is a popular option of an FEC code in a current 400 G Ethernet standard draft. In addition, application of the RS code and the BCH code is also important in a high-speed backplane/copper cable link at a rate of 25 Gbps or higher.

During processes of encoding and decoding an RS code and a BCH code, a data frame is used as a to-be-processed unit. On a receive side, an FEC frame boundary in a data stream first needs to be determined before decoding. In the prior art, there are two common methods for determining an FEC frame boundary. One method is that on a transmit side, special alignment markers are periodically added to a data stream, and on a receive side, an FEC frame boundary is determined by using these alignment markers. This method increases redundant information, consumes more circuit resources, and increases a bit rate. In addition, to control redundant information within a particular range, a time interval between two inserted alignment markers needs to be increased, which means that determining an FEC frame boundary needs to consume more time.

The other method is that a logic circuit on a receive side searches a data stream for an FEC frame by using a property of an FEC code, to implement determining of an FEC frame boundary. As shown in FIG. 1, in this method, it is first assumed that a first data block is an FEC frame. A starting location of the first data block is a first symbol (each symbol includes one bit), and a length of the first data block is equal to a length of one FEC frame. On the receive side, the first data block is sent to a decoder, and whether a property of the first data block accords with a property of an FEC frame is analyzed. If the property of the first data block accords with the property of the FEC frame, it is determined that the first symbol is an FEC frame boundary. If the property of the first data block does not accord with the property of the FEC frame, whether a property of a second data block accords with the property of the FEC frame is further analyzed. A starting location of the second data block is a second symbol, and an offset of the second symbol relative to the first symbol is N+1 symbols, where N is a quantity of symbols included in one FEC frame. During an actual operation process, it may be necessary to discard the second data block and determine whether a third symbol is an FEC frame boundary. The third symbol is a starting location of a third data block. An offset of the third symbol relative to the second symbol is N symbols. In a worst case of this method, N data blocks need to be checked, and data of a two-frame length needs to be received at each time of check. Therefore, in the worst case, data of 2×N×N symbols needs to be received, and therefore, a process of determining an FEC frame boundary consumes a relatively long time, and efficiency is relatively low.

The present embodiments provide a method for determining a frame boundary that is applicable to a communication link on which RS and BCH FEC codes are adopted, which can significantly improve efficiency in determining an FEC frame boundary.

SUMMARY

Embodiments provide a method and an apparatus for determining a frame boundary of a forward error correction (FEC) frame, and a decoding system, which can improve efficiency in determining a frame boundary of an FEC frame.

According to a first aspect, a method for determining a frame boundary of an FEC frame is provided, including receiving, by a frame boundary determining circuit, data, where the data includes N+P consecutive symbols with a first symbol being a starting point, N is a quantity of symbols included in one FEC frame, N is a positive integer multiple of P, N is greater than P, N consecutive symbols with the first symbol being a starting point that are in the N+P consecutive symbols constitute a first data block, N consecutive symbols with a second symbol being a starting point that are in the N+P consecutive symbols constitute a second data block, and an offset of the second symbol relative to the first symbol is P symbols. The method also includes obtaining s parameter values corresponding to the first data block and determining a first iterative item and a second iterative item of the second data block, where the first iterative item of the second data block is obtained according to first P consecutive symbols in the first data block, and the second iterative item of the second data block is obtained according to last P consecutive symbols in the second data block. Additionally, the method includes determining, according to the s parameter values corresponding to the first data block and the first iterative item and the second iterative item of the second data block, s parameter values corresponding to the second data block; and determining, according to the s parameter values corresponding to the second data block, whether the second symbol is a frame boundary of an FEC frame.

In a first possible implementation manner, the s parameter values corresponding to the first data block are s values of a correction factor, the s parameter values corresponding to the second data block are s values of a correction factor, and the first iterative item and the second iterative item of the second data block are determined by using the following formula:

$$H(a) = \sum_{j=0}^{P-1} r(j) \times a^j,$$

where a is a constant, and r(j) indicates the $j^{th}$ symbol in the first P consecutive symbols or the $j^{th}$ symbol in the last P consecutive symbols.

With reference to the foregoing possible implementation manner, in a second possible implementation manner, the s parameter values corresponding to the first data block are s values of a verification factor, the s parameter values corresponding to the second data block are s values of a verification factor, and the first iterative item and the second iterative item of the second data block are determined by using the following formula:

$$H(a) = \sum_{j=0}^{P-1} r(j) \times a^{n(j)},$$

where a is a variable, r(j) indicates the $j^{th}$ symbol in the first P consecutive symbols or the $j^{th}$ symbol in the last P consecutive symbols, and n(j) indicates a sequence number of the $j^{th}$ symbol.

With reference to the foregoing possible implementation manners, in a third possible implementation manner, the determining a first iterative item of the second data block includes: obtaining the first P consecutive symbols in the first data block from a first preset storage area, and determining the first iterative item of the second data block according to the first P consecutive symbols in the first data block and the formula H(a); or obtaining the first iterative item of the second data block from a second preset storage area.

With reference to the foregoing possible implementation manners, in a fourth possible implementation manner, if the s parameter values corresponding to the first data block are the s values of the correction factor, and the s parameter values corresponding to the second data block are the s values of the correction factor, 1<s≤2×t, where t is a maximum quantity of error symbols that can be corrected in one FEC frame, and the first iterative item and the second iterative item each include s values; and the s values of the correction factor corresponding to the second data block are determined by using the following formula:

$$S_{current,i} = S_{previous,i} \times (\alpha_i)^P + H_1(\alpha_i) \times (\alpha_i)^N + H_2(\alpha_i) \quad 1 \le i \le s,$$

where $S_{current,i}$ is the $i^{th}$ value of the correction factor corresponding to the second data block, $S_{previous,i}$ is the $i^{th}$ value of the correction factor corresponding to the first data block, $H_1(\alpha_i)$ is the $i^{th}$ value of the first iterative item of the second data block, $H_2(\alpha_i)$ is the $i^{th}$ value of the second iterative item of the second data block, and αi is the $i^{th}$ root of a generator polynomial of an FEC code.

With reference to the foregoing possible implementation manners, in a fifth possible implementation manner, if the s parameter values corresponding to the first data block are the s values of the verification factor, and the s parameter values corresponding to the second data block are the s values of the verification factor, s=1, and a value of the verification factor corresponding to the second data block is determined by using the following formula:

$$R_{current} = (R_{previous} \times x^P) \bmod g(x) + (H_1(x) \times x^P) \bmod g(x) + (H_2(x) \times x^P) \bmod g(x),$$

where $R_{current}$ is the value of the verification factor corresponding to the second data block, $R_{previous}$ is a value of the verification factor corresponding to the first data block, $H_1(x)$ is the first iterative item of the second data block, $H_2(x)$ is the second iterative item of the second data block, and g(x) is a generator polynomial of an FEC code.

With reference to the foregoing possible implementation manners, in a sixth possible implementation manner, the determining, according to the s parameter values corresponding to the second data block, whether the second symbol is a frame boundary of an FEC frame includes: if the s parameter values corresponding to the second data block are all 0, determining that the second symbol is a frame boundary of an FEC frame; or if at least one parameter value in the s parameter values corresponding to the second data block is not equal to 0, determining that the second symbol is not a frame boundary of an FEC frame.

With reference to the foregoing possible implementation manners, in a seventh possible implementation manner, the method further includes: if a quantity of symbols included in the data is less than 2N, receiving new data, where the new data includes P consecutive symbols, the new data is adjacent to the N+P consecutive symbols and is received after the N+P consecutive symbols, N consecutive symbols with a third symbol in the second data block being a starting point constitute a third data block, and an offset of the third symbol relative to the second symbol is P symbols; if it is determined that the second symbol is not a frame boundary of an FEC frame, determining a first iterative item and a second iterative item of the third data block, where the first iterative item of the third data block is obtained according to first P consecutive symbols in the second data block, and the second iterative item of the third data block is obtained according to the P consecutive symbols included in the new data; determining, according to the s parameter values corresponding to the second data block and the first iterative item and the second iterative item of the third data block, s parameter values corresponding to the third data block; and determining, according to the s parameter values corresponding to the third data block, whether the third symbol is a frame boundary of an FEC frame.

With reference to the foregoing possible implementation manners, in an eighth possible implementation manner, the method further includes: if a quantity of symbols included in the data is equal to 2N, receiving new data, where the new data includes a fourth data block, the fourth data block is constituted by N consecutive symbols with a fourth symbol being a starting point, the new data is not adjacent to the N+P consecutive symbols and is received after the N+P consecutive symbols, an offset of a starting bit of the fourth symbol relative to a starting bit n1 of the second symbol is L symbols, Lmodm≠0, or Lmodm=0 and LmodP≠0, mod indicates a modulo operation, and m is a quantity of bits included in one symbol; if it is determined that the second symbol is not a frame boundary of an FEC frame, determining, according to the N consecutive symbols included in the fourth data block, s parameter values corresponding to the fourth data block; and determining, according to the s parameter values corresponding to the fourth data block, whether the fourth symbol is a frame boundary of an FEC frame.

According to a second aspect, an apparatus for determining a frame boundary of an FEC frame is provided, including a receiver, a parameter calculator, and a comparator, where the receiver is configured to receive data, where the data includes N+P consecutive symbols with a first symbol being a starting point, N is a quantity of symbols included in one FEC frame, N is a positive integer multiple of P, N is greater than P, N consecutive symbols with the first symbol being a starting point that are in the N+P consecutive symbols constitute a first data block, N consecutive symbols with a second symbol being a starting point that are in the N+P consecutive symbols constitute a second data block, and an offset of the second symbol relative to the first symbol is P symbols. The parameter calculator is configured to obtain s parameter values corresponding to the first data block, determine a first iterative item and a second iterative item of the second data block received by the receiver, and determine, according to the s parameter values corresponding to the first data block and the first iterative item and the second iterative item of the second data block, s parameter values corresponding to the second data block, where the first iterative item of the second data block is obtained according to first P consecutive symbols in the first data block, and the second iterative item of the second data block is obtained according to last P consecutive symbols in the second data block; and the comparator is configured to determine, according to the s parameter values that are corresponding to the second data block and obtained by the parameter calculator, whether the second symbol is a frame boundary of an FEC frame.

In a first possible implementation manner, the s parameter values corresponding to the first data block are s values of a correction factor, the s parameter values corresponding to the second data block are s values of a correction factor, and the first iterative item and the second iterative item of the second data block are determined by using the following formula:

$$H(a) = \sum_{j=0}^{P-1} r(j) \times a^j,$$

where a is a constant, and r(j) indicates the $j^{th}$ symbol in the first P consecutive symbols or the $j^{th}$ symbol in the last P consecutive symbols.

With reference to the foregoing possible implementation manner, in a second possible implementation manner, the s parameter values corresponding to the first data block are s values of a verification factor, the s parameter values corresponding to the second data block are s values of a verification factor, and the first iterative item and the second iterative item of the second data block are determined by using the following formula:

$$H(a) = \sum_{j=0}^{P-1} r(j) \times a^{n(j)},$$

where a is a variable, r(j) indicates the $j^{th}$ symbol in the first P consecutive symbols or the $j^{th}$ symbol in the last P consecutive symbols, and n(j) indicates a sequence number of the $j^{th}$ symbol.

With reference to the foregoing possible implementation manners, in a third possible implementation manner, the apparatus further includes a memory, where the memory is configured to store the first P consecutive symbols in the first data block; and the parameter calculator is specifically configured to: obtain the first P consecutive symbols in the first data block that are stored in the memory, and determine the first iterative item of the second data block according to the first P consecutive symbols in the first data block and the formula H(a); or the memory is configured to store the first iterative item of the second data block; and the parameter calculator is specifically configured to obtain the first iterative item that is of the second data block and is stored in the memory.

With reference to the foregoing possible implementation manners, in a fourth possible implementation manner, if the s parameter values corresponding to the first data block are the s values of the correction factor, and the s parameter values corresponding to the second data block are the s values of the correction factor, $1 < s \leq 2 \times t$, where t is a maximum quantity of error symbols that can be corrected in one FEC frame, and the first iterative item and the second iterative item each includes values; and the parameter calculator is specifically configured to determine, according to the following formula, the s values of the correction factor corresponding to the second data block:

$$S_{current,i} = S_{previous,i} \times (\alpha_i)^P + H_1(\alpha_i) \times (\alpha_i)^N + H_2(\alpha_i) \quad 1 \leq i \leq s,$$

where $S_{current,i}$ is the $i^{th}$ value of the correction factor corresponding to the second data block, $S_{previous,i}$ is the $i^{th}$ value of the correction factor corresponding to the first data block, $H_1(\alpha i)$ is the $i^{th}$ value of the first iterative item of the second data block, $H_2(\alpha i)$ is the $i^{th}$ value of the second iterative item of the second data block, and $\alpha i$ is the $i^{th}$ root of a generator polynomial of an FEC code.

With reference to the foregoing possible implementation manners, in a fifth possible implementation manner, if the s parameter values corresponding to the first data block are the s values of the verification factor, and the s parameter values corresponding to the second data block are the s values of the verification factor, s=1, and the parameter calculator is specifically configured to determine, according to the following formula, a value of the verification factor corresponding to the second data block:

$$R_{current} = (R_{previous} \times x^P) \bmod g(x) + (H_1(x) \times x^P) \bmod g(x) + (H_2(x) \times x^P) \bmod g(x),$$

where $R_{current}$ is the value of the verification factor corresponding to the second data block, $R_{previous}$ is a value of the verification factor corresponding to the first data block, $H_1(x)$ is the first iterative item of the second data block, $H_2(x)$ is the second iterative item of the second data block, and g(x) is a generator polynomial of an FEC code.

With reference to the foregoing possible implementation manners, in a sixth possible implementation manner, the comparator is specifically configured to: if the s parameter values that are corresponding to the second data block and determined by the parameter calculator are all 0, determine that the second symbol is a frame boundary of an FEC frame; or if at least one parameter value in the s parameter values that are corresponding to the second data block and determined by the parameter calculator is not equal to 0, determine that the second symbol is not a frame boundary of an FEC frame.

With reference to the foregoing possible implementation manners, in a seventh possible implementation manner, the receiver is further configured to: if a quantity of symbols included in the data is less than 2N, receive new data, where the new data includes P consecutive symbols, the new data is adjacent to the N+P consecutive symbols and is received after the N+P consecutive symbols, N consecutive symbols with a third symbol in the second data block being a starting point constitute a third data block, and an offset of the third symbol relative to the second symbol is P symbols; the parameter calculator is further configured to: if the comparator determines that the second symbol is not a frame boundary of an FEC frame, determine a first iterative item and a second iterative item of the third data block, where the first iterative item of the third data block is obtained according to first P consecutive symbols in the second data block, and the second iterative item of the third data block is obtained according to the P consecutive symbols included in the new data; and determine, according to the s parameter values corresponding to the second data block and the first iterative item and the second iterative item of the third data block, s parameter values corresponding to the third data block; and the comparator is further configured to determine, according to the s parameter values that are corresponding to the third data block and determined by the parameter calculator, whether the third symbol is a frame boundary of an FEC frame.

With reference to the foregoing possible implementation manners, in an eighth possible implementation manner, the receiver is further configured to: if the quantity of the symbols included in the data is equal to 2N, receive new data, where the new data includes a fourth data block, the fourth data block is constituted by N consecutive symbols with a fourth symbol being a starting point, the new data is not adjacent to the N+P consecutive symbols and is received after the N+P consecutive symbols, an offset of a starting bit of the fourth symbol relative to a starting bit of the second symbol is L symbols, Lmodm≠0, or Lmodm=0 and LmodP≠0, mod indicates a modulo operation, and m is a quantity of bits included in one symbol; the parameter calculator is further configured to: if the comparator determines that the second symbol is not a frame boundary of an FEC frame, determine, according to the N consecutive symbols included in the fourth data block, s parameter values corresponding to the fourth data block; and the comparator is further configured to determine, according to the s parameter values that are corresponding to the fourth data block and determined by the parameter calculator, whether the fourth symbol is a frame boundary of an FEC frame.

According to a third aspect, a decoding system is provided, including a frame boundary determining circuit, an error diagnosis device, and an error correction device, where the frame boundary determining circuit is configured to determine a frame boundary of an FEC code, the error diagnosis device is configured to determine, according to the frame boundary determined by the frame boundary determining circuit, an error that exists in an FEC frame, the error correction device is configured to perform error correction on the FEC frame according to the error that exists in the FEC frame and is determined by the error diagnosis device, and the frame boundary determining circuit is specifically configured to: receive data, where the data includes N+P consecutive symbols with a first symbol being a starting point, N is a quantity of symbols included in one FEC frame, N is a positive integer multiple of P, N is greater than P, N consecutive symbols with the first symbol being a starting point that are in the N+P consecutive symbols constitute a first data block, N consecutive symbols with a second symbol being a starting point that are in the N+P consecutive symbols constitute a second data block, and an offset of the second symbol relative to the first symbol is P symbols; obtain s parameter values corresponding to the first data block; determine a first iterative item and a second iterative item of the second data block, where the first iterative item of the second data block is obtained according to first P consecutive symbols in the first data block, and the second iterative item of the second data block is obtained according to last P consecutive symbols in the second data block; determine, according to the s parameter values corresponding to the first data block and the first iterative item and the second iterative item of the second data block, s parameter values corresponding to the second data block; and determine, according to the s parameter values corresponding to the second data block, whether the second symbol is a frame boundary of an FEC frame.

According to the method and the apparatus for determining a frame boundary of an FEC frame, and the decoding system that are provided based on the foregoing technical solutions in the present embodiments, s parameter values corresponding to a second data block are determined by using s parameter values corresponding to a first data block, where the first data block is constituted by N consecutive symbols with a first symbol being a starting point, the second data block is constituted by N consecutive symbols with a second symbol being a starting point, and an offset of the second symbol relative to the first symbol is P symbols; and a frame boundary determining circuit determines, according to the s parameter values corresponding to the second data block, whether the second symbol is a frame boundary of an FEC frame. For received 2N consecutive symbols, the frame boundary determining circuit can detect, by using an iterative algorithm, whether N/P symbols in the 2N consecutive symbols are a frame boundary of an FEC frame, thereby improving efficiency in determining a frame boundary of an FEC frame, increasing a synchronization speed of a communication link, and enhancing system performance.

BRIEF DESCRIPTION OF THE DRAWINGS

To describe the technical solutions in the embodiments more clearly, the following briefly describes the accompanying drawings required for describing the embodiments or the prior art. Apparently, the accompanying drawings in the following description show merely some embodiments, and a person of ordinary skill in the art may still derive other drawings from these accompanying drawings without creative efforts.

DETAILED DESCRIPTION OF ILLUSTRATIVE EMBODIMENTS

The following clearly describes the technical solutions in the embodiments with reference to the accompanying drawings in the embodiments. Apparently, the described embodiments are some but not all of the embodiments. All other embodiments obtained by a person of ordinary skill in the art based on the embodiments without creative efforts shall fall within the protection scope of the present embodiments.

It should be understood that the technical solutions in the embodiments may be applied to a communications system. The communications system may be a Global System for Mobile Communications (GSM) system, a Code Division Multiple Access (CDMA) system, a Wideband Code Division Multiple Access (WCDMA) system, a general packet radio service (GPRS), a Long Term Evolution (LTE) system, an LTE frequency division duplex (FDD) system, an LTE time division duplex (TDD) system, a Universal Mobile Telecommunications System (UMTS), or a Worldwide Interoperability for Microwave Access (WiMAX) communications system.

It should be understood that a method and an apparatus for determining a frame boundary of an FEC frame, and a decoding system according to the present application are mainly applicable to a scenario in which forward error correction is performed by using a Reed Solomon (RS) code or a -Chaudhuri-Hocquenghem (BCH) code, such as a high-speed backplane link, an Ethernet interface, an optical network interface, an air interface in wireless communication, or a data interface of a storage device in which forward error correction is performed by using an RS code or a BCH code. In the present application, a definition of a frame boundary of a forward error correction (FEC) frame is the same as a definition of an FEC frame boundary. In the present application, consecutive symbols refer to continuously sent symbols or continuously received symbols. For example, a transmitter may continuously send a plurality of symbols through a serial interface. A receiver may continuously receive a plurality of symbols through a serial interface. In the present application, that first data is adjacent to second data refers to that if a time at which the first data is received is later than a time at which the second data is received, a last received symbol in the second data and a first received symbol in the first data are two consecutive symbols, or if the time at which the first data is received is earlier than the time at which the second data is received, a last received symbol in the first data and a first received symbol in the second data are two consecutive symbols. For example, that new data is adjacent to N+P consecutive symbols and is received after the N+P consecutive symbols refers to that a last received symbol in the N+P consecutive symbols and a first received symbol in the new data are two consecutive symbols.

Figure 1:
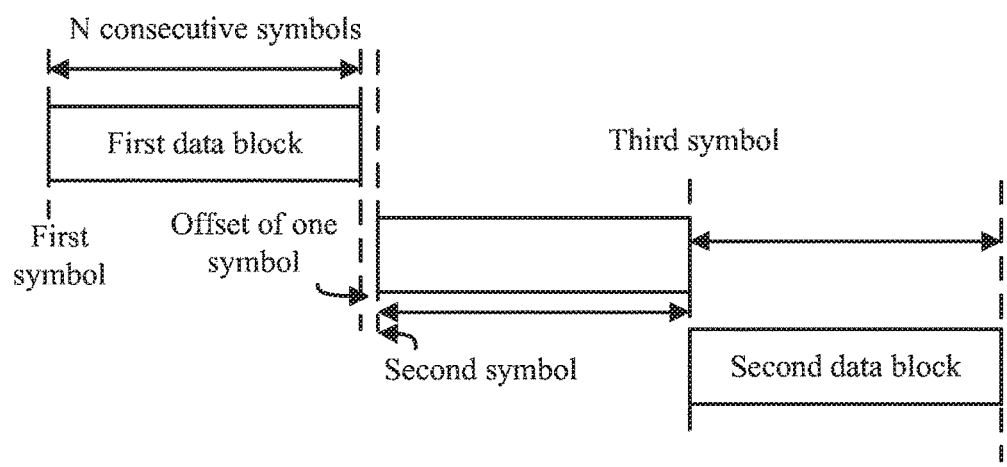
FIG. 1 is a schematic diagram of a method for determining a frame boundary of an FEC frame according to the prior art.
Figure 2:
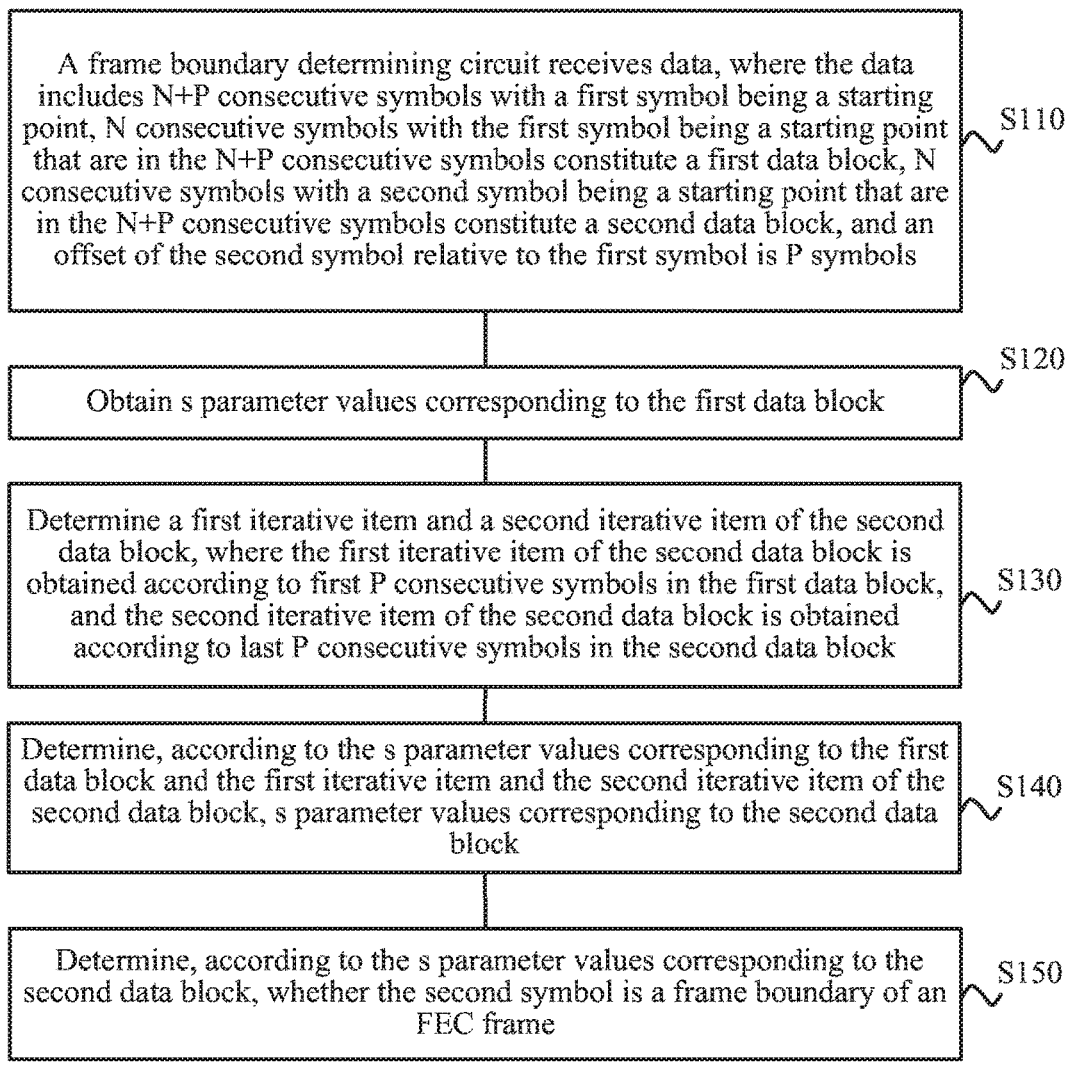
FIG. 2 is a schematic flowchart of a method for determining a frame boundary of an FEC frame according to an embodiment.

FIG. 2 is a schematic flowchart of a method 100 for determining a frame boundary of an FEC frame according to an embodiment. The method 100 may be executed by any apparatus that has a function of determining a frame boundary of a forward error correction FEC frame. For example, the method 100 may be executed by a frame boundary determining circuit, which is not limited in this embodiment.

S110. The frame boundary determining circuit receives data, where the data includes N+P consecutive symbols with a first symbol being a starting point, N is a quantity of symbols included in one FEC frame, N is a positive integer multiple of P, N is greater than P, N consecutive symbols with the first symbol being a starting point that are in the N+P consecutive symbols constitute a first data block, N consecutive symbols with a second symbol being a starting point that are in the N+P consecutive symbols constitute a second data block, and an offset of the second symbol relative to the first symbol is P symbols.

In this embodiment, one FEC frame includes N symbols, and each symbol includes m bits. Therefore, a quantity of bits included in one FEC frame is $B=N\times m$. For an RS code, m is an integer greater than 1. For a BCH code, $m=1$, that is, one symbol includes one bit. Therefore, for a BCH code, a symbol in the following description is equivalent to a bit.

In this embodiment, P may be a positive integer greater than or equal to 1. For example, P is a quantity of parameter values that can be accommodated by a data channel of an FEC codec. P may be used to indicate a degree of parallelism of the FEC codec.

To determine whether a symbol is a frame boundary of an FEC frame, the frame boundary determining circuit may assume that a data block with the symbol being a starting point, which includes N consecutive symbols, is one FEC frame. It is determined, by determining whether a parameter value of the data block agrees with a parameter value of an FEC frame, whether the data block is an FEC frame and whether the symbol is a frame boundary of an FEC frame. Specifically, if a property of the data block agrees with a property of an FEC frame, the data block is an FEC frame, and the symbol is a frame boundary of an FEC frame. If the property of the data block does not agree with a property of an FEC frame, the data block is not an FEC frame, and the symbol is not a frame boundary of an FEC frame.

Figure 3:
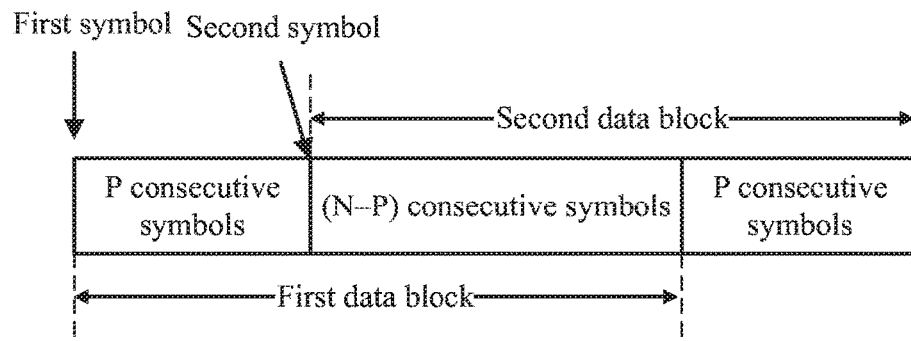
FIG. 3 is a schematic diagram of a first data block and a second data block in a method for determining a frame boundary of an FEC frame according to an embodiment.

The frame boundary determining circuit may receive data that includes an FEC frame. Specifically, the frame boundary determining circuit may receive data in a unit of a clock period of the frame boundary determining circuit. Specifically, P consecutive symbols are received in each clock period, where $Q=N/P$. Optionally, the frame boundary determining circuit may perform receiving for Q+1 times to obtain the N+P consecutive symbols with the first symbol being the starting point. As shown in FIG. 3, the N+P consecutive symbols include first P consecutive symbols, (N−P) consecutive symbols adjacent to the first P consecutive symbols, and last P consecutive symbols. The first P consecutive symbols and the (N−P) consecutive symbols constitute the first data block. The (N−P) consecutive symbols and the last P consecutive symbols constitute the second data block. That is, first N consecutive symbols in the (N+P) consecutive symbols constitute the first data block, and last N consecutive symbols in the (N+P) consecutive symbols constitute the second data block. In this case, an offset of the second data block relative to the first data block is P symbols.

Figure 4:
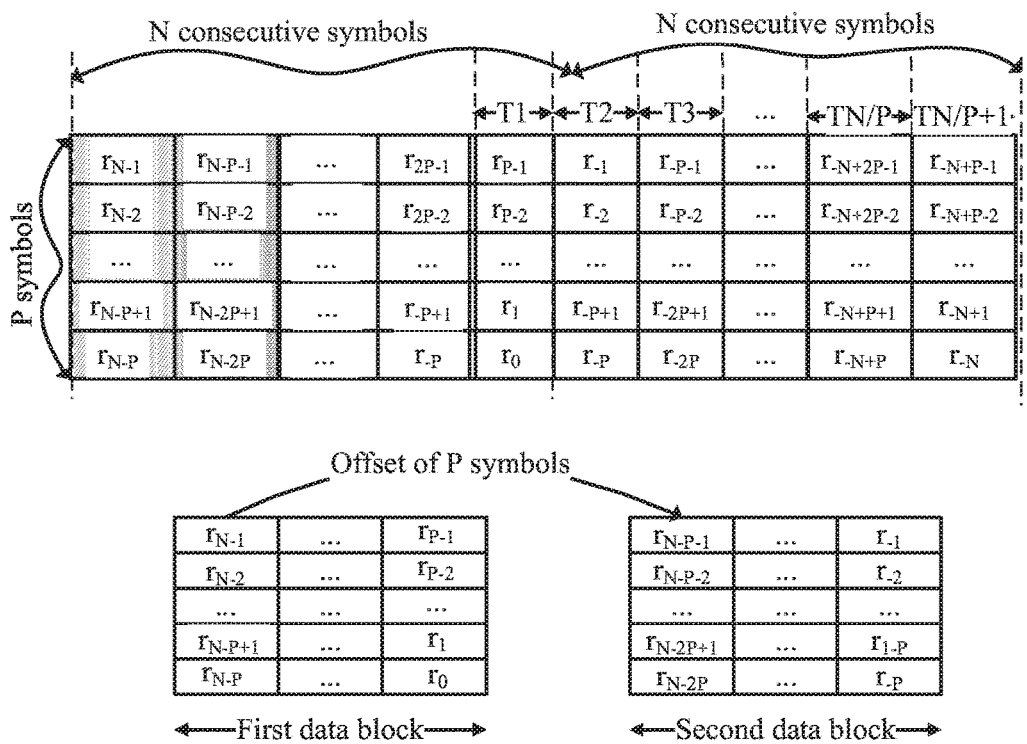
FIG. 4 is a schematic diagram of an example of a method for determining a frame boundary of an FEC frame according to an embodiment.

FIG. 4 is used as an example. The frame boundary determining circuit may first perform receiving for Q times to obtain N consecutive symbols rN−1 to r0. The frame boundary determining circuit may receive P consecutive symbols in one column in each clock period and successively receive the N consecutive symbols in ascending order of a column number in a table shown in FIG. 4. That is, symbols rN−1 to rN−P in the first column are first received, and symbols rP−1 to r0 in the $Q^{th}$ column are last received. The N consecutive symbols rN−1 to r0 constitute the first data block. In this case, the first symbol is specifically a symbol rN−1. Then, the frame boundary determining circuit may receive P consecutive symbols r−1 to r−P. The frame boundary determining circuit receives N+P consecutive symbols, and the last N consecutive symbols rN−P−1 to r−P in the N+P consecutive symbols constitute the second data block. In this case, the second symbol is specifically a symbol rN−P−1. For ease of description, the first data block may be considered as a previous data block of the second data block. The second data block may be considered as a next data block of the first data block. In this embodiment, a location relationship between any data block and a previous data block or a next data block of the data block is similar to a location relationship between the first data block and the second data block. That is, a starting symbol of any data block has a backward offset of P symbols, relative to a starting symbol of a previous data block of the data block.

In this embodiment, to determine a frame boundary of an FEC frame, an offset is performed in a unit of P symbols. Specifically, the frame boundary determining circuit may first determine whether a starting symbol (that is, the first symbol) of the first data block is a frame boundary of an FEC frame, and when determining that the first symbol is not a frame boundary of an FEC frame, the frame boundary determining circuit determines whether a starting symbol (that is, the second symbol) of the second data block is a frame boundary of an FEC frame. Optionally, the first symbol may be the first to-be-detected symbol in the data, that is, the data does not include a previous data block of the first data block; or the first symbol may be a middle to-be-detected symbol in the data, that is, the data includes a previous data block of the first data block, which is not limited in this embodiment. It can be learned from the foregoing that in this embodiment, a degree of parallelism of the determining a frame boundary of an FEC frame is Q, which indicates a quantity of symbols that can be detected in data of a length of two FEC frames.

S120. Obtain s parameter values corresponding to the first data block.

The s parameter values are s values of a correction factor or s values of a verification factor, and s is an integer greater than or equal to 1. If the s parameter values are the s values of the verification factor, s=1; if the s parameter values are the s values of the correction factor, s may be an integer less than or equal to 2t, where t is a maximum quantity of error symbols that can be corrected in one FEC frame. Generally, a larger value of s indicates higher accuracy of a determined frame boundary but more consumed circuit resources. Therefore, a value of s may be determined according to an actual accuracy requirement and actual resource consumption, for example, s=P, which is not limited in this embodiment.

The frame boundary determining circuit may determine the s parameter values corresponding to the first data block in a plurality of manners. In an optional embodiment, when determining whether the first symbol is a frame boundary of an FEC frame, the frame boundary determining circuit may determine the s parameter values corresponding to the first data block, where the frame boundary determining circuit may determine the s parameter values corresponding to the first data block in a plurality of manners. Optionally, if the data does not include the previous data block of the first data block, the frame boundary determining circuit may determine, according to the N consecutive symbols included in the first data block, the s parameter values corresponding to the first data block; if the data includes the previous data block of the first data block, the frame boundary determining circuit may determine, according to s parameter values corresponding to the previous data block of the first data block, the s parameter values corresponding to the first data block, which is not limited in this embodiment. After determining the s parameter values corresponding to the first data block, the frame boundary determining circuit may store, in a memory, the s parameter values corresponding to the first data block. Correspondingly, when determining whether the second symbol is a frame boundary of an FEC frame, the frame boundary determining circuit may obtain, from the memory, the s parameter values corresponding to the first data block, which is not limited in this embodiment.

S130. Determine a first iterative item and a second iterative item of the second data block, where the first iterative item of the second data block is obtained according to first P consecutive symbols in the first data block, and the second iterative item of the second data block is obtained according to last P consecutive symbols in the second data block.

FIG. 4 is still used as an example. The first iterative item of the second data block may be obtained according to first P consecutive symbols (that is, the symbols rN−1 to rN−P) in the symbols rN−1 to r0 (that is, the first data block), and the second iterative item of the second data block may be obtained according to last P consecutive symbols (the symbols r−1 to r−P) in the symbols rN−P−1 to r−P (that is, the second data block).

S140. Determine, according to the s parameter values corresponding to the first data block and the first iterative item and the second iterative item of the second data block, s parameter values corresponding to the second data block.

The s parameter values corresponding to the second data block may be s values of a correction factor or s values of a verification factor. If the s parameter values are the s values of the correction factor, the frame boundary determining circuit may determine, according to the s values of the correction factor corresponding to the first data block and the first iterative item and the second iterative item of the second data block, the s values of the correction factor corresponding to the second data block.

If the s parameter values are the s values of the verification factor, s=1, and the frame boundary determining circuit may determine, according to a value of the verification factor corresponding to the first data block and the first iterative item and the second iterative item of the second data block, a value of the verification factor corresponding to the second data block.

S150. Determine, according to the s parameter values corresponding to the second data block, whether the second symbol is a frame boundary of an FEC frame.

Therefore, according to the method for determining a frame boundary of an FEC frame in this embodiment, s parameter values corresponding to a second data block are determined by using s parameter values corresponding to a first data block, where the first data block is constituted by N consecutive symbols with a first symbol being a starting point, the second data block is constituted by N consecutive symbols with a second symbol being a starting point, and an offset of the second symbol relative to the first symbol is P symbols; and a frame boundary determining circuit determines, according to the s parameter values corresponding to the second data block, whether the second symbol is a frame boundary of an FEC frame. For received 2N consecutive symbols, the frame boundary determining circuit can detect, by using an iterative algorithm, whether N/P symbols in the 2N consecutive symbols are a frame boundary of an FEC frame, thereby improving efficiency in determining a frame boundary of an FEC frame.

In this embodiment, the $i^{th}$ value Si of a correction factor of an RS code and a BCH code may be determined by using the following formula:

$$S_i = r(x)|_{x=\alpha_i} \quad (1)$$

A value of a verification factor R of an RS code and a BCH code is determined by using the following formula:

$$R = r(x) \bmod g(x) \quad (2),$$

where: $g(x)$ is a generator polynomial of the RS code and the BCH code, and $r(x)$ is a code word polynomial, which may be respectively indicated by using formula (3) and formula (4):

$$g(x) = \prod_{i=0}^{2t-1} (x - \alpha_i), \text{ and} \quad (3)$$

$$r(x) = q(x) \times g(x) + e(x), \quad (4)$$

where: $\alpha i$ is the $i^{th}$ root of the generator polynomial, $1 \le i \le 2 \times t$, $e(x)$ is an error polynomial, and when a received code word is a valid FEC frame, $e(x)=0$.

It can be learned from formula (i) and formula (2) that if a data block is a valid FEC frame, 2t values of a correction factor are all 0, and a value of a verification factor is 0. In this embodiment, it may be determined, by using this property, whether the second data block is a true FEC frame, thereby determining whether the second symbol is a frame boundary of an FEC frame.

Optionally, in S150, the determining, according to the s parameter values corresponding to the second data block, whether the second symbol is a frame boundary of an FEC frame includes: if the s parameter values corresponding to the second data block are all 0, determining that the second symbol is a frame boundary of an FEC frame; or if at least one parameter value in the s parameter values corresponding to the second data block is not equal to 0, determining that the second symbol is not a frame boundary of an FEC frame.

Specifically, if the s parameter values are the s values of the correction factor, a value of s may be a preset integer less than or equal to 2t. In this case, if the s values of the correction factor corresponding to the second data block are all 0, the frame boundary determining circuit may determine that the second data block is a true FEC frame, and the second symbol is a frame boundary of an FEC frame. On the contrary, if at least one of the s values of the correction factor corresponding to the second data block is not 0, it is determined that the second symbol is not a frame boundary of an FEC frame. If the s parameter values are the s values of the verification factor, s=1. In this case, if the value of the verification factor corresponding to the second data block is 0, it is determined that the second data block is a true FEC frame, and the second symbol is a frame boundary of an FEC frame. On the contrary, if the value of the verification factor corresponding to the second data block is not 0, it is determined that the second symbol is not a frame boundary of an FEC frame. Alternatively, the frame boundary determining circuit may simultaneously determine the s values of the correction factor and the value of the verification factor that are corresponding to the second data block, and it is determined that the second symbol is a frame boundary of an FEC frame only when the s values of the correction factor and the value of the verification factor that are corresponding to the second data block are all 0, which is not limited in this embodiment.

FIG. 4 is still used as an example. It can be learned from formulas (1) to (4) that the following relationship exists between a value of Si corresponding to the second data block and a value of Si corresponding to the first data block:

$$S_{current,i} = S_{previous,i} \times (\alpha_i)^P + H_{1,i} \times (\alpha_i)^N + H_{2,i} \quad (5),$$

where:

$1 \le i \le s$, $S_{current,i}$ is the $i^{th}$ value of the correction factor corresponding to the second data block, $S_{previous,i}$ is the ith value of the correction factor corresponding to the first data block, $H_{1,i}$ is the $i^{th}$ value of the first iterative item of the second data block and is determined by using formula (6), and $H_{2,i}$ is the $i^{th}$ value of the second iterative item of the second data block and is determined by using formula (7).

$$H_{1,i} = \sum_{k=N-P}^{N-1} r_k \times (\alpha_i)^{k-(N-P)}, \text{ and} \quad (6)$$

$$H_{2,i} = \sum_{k=-P}^{-1} r_k \times (\alpha_i)^{k+P}, \quad (7)$$

where: $r_k$ indicates a symbol whose sequence number is k. It can be learned from formula (6) that a value of $H_{1,i}$ depends on the first P consecutive symbols (the symbols rN−1 to rN−P) in the first data block, where the symbol rN−1 is the 0th symbol in the P consecutive symbols, the symbol rN−P is the $(P-1)^{th}$ symbol in the P consecutive symbols, and the rest can be deduced by analogy. It can be learned from formula (7) that a value of $H_{2,i}$ depends on the last P consecutive symbols (that is, the symbols r−1 to r−P) in the second data block, where the symbol r−1 is the 0th symbol in the P consecutive symbols, the symbol r−P is the $(P-1)^{th}$ symbol in the P consecutive symbols, and the rest can be deduced by analogy.

Similarly, it can be learned from formulas (1) to (4) that the following relationship exists between a value of R corresponding to the second data block and a value of R corresponding to the first data block:

$$R_{current} = (R_{previous} \times x^P) \bmod g(x) + (H_{1R} \times x^P) \bmod g(x) + (H_{2R} \times x^P) \bmod g(x) \quad (8),$$

where: $R_{current}$ is the value of the verification factor corresponding to the second data block, $R_{previous}$ is the value of the verification factor corresponding to the first data block, $H_{1R}$ is the first iterative item of the second data block and is determined by using formula (9), and $H_{2R}$ is the second iterative item of the second data block and is determined by using formula (10).

$$H_{1R} = \sum_{k=N-P}^{N-1} r_k \times x^k, \text{ and} \quad (9)$$

$$H_{2R} = \sum_{k=-P}^{-1} r_k \times x^k, \quad (10)$$

where a value of $H_{1R}$ depends on the first P consecutive symbols (that is, the symbols rN−1 to rN−P) in the first data block, and a value of $H_{2R}$ depends on the last P consecutive symbols (that is, the symbols r−1 to r−P) in the second data block.

It can be learned from the foregoing that optionally, the s parameter values corresponding to the first data block are the s values of the correction factor, the s parameter values corresponding to the second data block are the s values of the correction factor, and the first iterative item and the second iterative item of the second data block may be determined by using the following formula:

$$H(a) = \sum_{j=0}^{P-1} r(j) \times a^j, \quad (11)$$

where a is a constant, and r(j) indicates the $j^{th}$ symbol in the first P consecutive symbols or the $j^{th}$ symbol in the last P consecutive symbols.

The first iterative item of the second data block may be obtained by substituting the first P consecutive symbols in the first data block into the formula H(a), and the second iterative item of the second data block may be obtained by substituting the last P consecutive symbols in the second data block into the formula H(a).

Specifically, the first P consecutive symbols or the last P consecutive symbols may be sorted according to a time sequence of receiving, so that the first P consecutive symbols or the last P consecutive symbols are successively the 0th symbol to the $(P-1)^{th}$ symbol, where the 0th symbol in the first P symbols or the last P symbols is first received, and the $(P-1)^{th}$ symbol in the first P symbols or the last P symbols is last received, which is not limited in this embodiment.

Optionally, in another embodiment, the s parameter values corresponding to the first data block are the s values of the verification factor, the s parameter values corresponding to the second data block are the s values of the verification factor, and the first iterative item and the second iterative item of the second data block are determined by using the following formula:

$$H(a) = \sum_{j=0}^{P-1} r(j) \times a^{n(j)}, \quad (12)$$

where a is a variable, r(j) indicates the $j^{th}$ symbol in the first P consecutive symbols or the $j^{th}$ symbol in the last P consecutive symbols, and n(j) indicates a sequence number of the $j^{th}$ symbol.

In this case, a may be specifically x in a generator polynomial g(x). FIG. 4 is used as an example. The first P consecutive symbols (rN−1 to rN−P) in the first data block may be sorted according to the time sequence of receiving, where the symbol rN−1 is the 0th symbol in the first P consecutive symbols, that is, a sequence number of the 0th symbol is N−1; the symbol rN−P is the $(P-1)^{th}$ symbol in the first P consecutive symbols, that is, a sequence number of the $(P-1)^{th}$ symbol is N−P; and the rest can be deduced by analogy, which is not limited in this embodiment.

Optionally, in another embodiment, if the s parameter values corresponding to the first data block are the s values of the correction factor, and the s parameter values corresponding to the second data block are the s values of the correction factor, 1<s≤2×t, where t is a maximum quantity of error symbols that can be corrected in one FEC frame, and the first iterative item and the second iterative item each include s values. Correspondingly, the s values of the correction factor corresponding to the second data block are determined by using the following formula:

$$S_{current,i} = S_{previous,i} \times (\alpha_i)^P + H_1(\alpha_i) \times (\alpha_i)^N + H_2(\alpha_i) \quad 1 \le i \le s, \quad (13),$$

where $S_{current,i}$ is the $i^{th}$ value of the correction factor corresponding to the second data block, $S_{previous,i}$ is the $i^{th}$ value of the correction factor corresponding to the first data block, $H_1(\alpha_i)$ is the $i^{th}$ value of the first iterative item of the second data block, $H_2(\alpha_i)$ is the $i^{th}$ value of the second iterative item of the second data block, and $\alpha_i$ is the $i^{th}$ root of a generator polynomial of an FEC code.

In this case, values of $H_1(\alpha_i)$ and $H_2(\alpha_i)$ may be determined by using formula (11). For example, the values of $H_1(\alpha_i)$ and $H_2(\alpha_i)$ may be respectively determined by using formula (6) and formula (7). The FEC code may refer to an FEC code included in an FEC frame.

Optionally, in another embodiment, if the s parameter values corresponding to the first data block are the s values of the verification factor, and the s parameter values corresponding to the second data block are the s values of the correction factor, s=1, and the value of the verification factor corresponding to the second data block is determined by using the following formula:

$$R_{current} = (R_{previous} \times x^P) \bmod g(x) + (H_1(x) \times x^P) \bmod g(x) + (H_2(x) \times x^P) \bmod g(x) \quad (14),$$

where $R_{current}$ is the value of the verification factor corresponding to the second data block, $R_{previous}$ is the value of the verification factor corresponding to the first data block, $H_1(x)$ is the first iterative item of the second data block, $H_2(x)$ is the second iterative item of the second data block, and g(x) is a generator polynomial of an FEC code.

In this case, values of $H_1(x)$ and $H_2(x)$ may be determined by using formula (12). For example, the values of $H_1(x)$ and $H_2(x)$ may be respectively determined by using formula (9) and formula (10). The FEC code may refer to an FEC code included in an FEC frame.

In this embodiment, in S130, the frame boundary determining circuit may determine the first iterative item of the second data block in a plurality of manners. Optionally, the frame boundary determining circuit may store the first P consecutive symbols in the first data block in the memory in advance. Correspondingly, when the s parameter values corresponding to the second data block are calculated, the frame boundary determining circuit may obtain the first P consecutive symbols in the first data block from the memory, and substitute the first P consecutive symbols into formula (6) or (9) to obtain the first iterative item of the second data block. Correspondingly, the frame boundary determining circuit may also store first P consecutive symbols in the second data block in a first preset storage area in advance, so that when detecting a next data block, the frame boundary determining circuit obtains the first P consecutive symbols in the second data block from the first preset storage area, and determines a first iterative item of the next data block according to the first P consecutive symbols, which is not limited in this embodiment.

Optionally, in another embodiment, the frame boundary determining circuit may calculate the first iterative item of the second data block in advance according to the first P consecutive symbols in the first data block, and store the first iterative item in the memory. Correspondingly, when the second data block is detected, the first iterative item of the second data block is obtained from the memory, which is not limited in this embodiment.

In S130, the determining a first iterative item of the second data block includes: obtaining the first P consecutive symbols in the first data block from the first preset storage area, and determining the first iterative item of the second data block according to the first P consecutive symbols in the first data block and the formula H(a); or obtaining the first iterative item of the second data block from a second preset storage area.

Optionally, in another embodiment, the method 100 further includes: substituting the first P consecutive symbols in the second data block into the formula H(a), and obtaining a first iterative item of a next data block of the second data block, where an offset of a starting symbol of the next data block relative to the second symbol is P symbols, and the starting symbol of the next data block belongs to the second data block; and storing the first iterative item of the next data block in the second preset storage area.

In this way, when determining that the second symbol is not a frame boundary of an FEC frame, the frame boundary determining circuit may detect the next data block of the second data block and obtain the first iterative item of the next data block from the second preset storage area of the memory, which is not limited in this embodiment.

Optionally, in another embodiment, after determining the s parameter values corresponding to the second data block, the frame boundary determining circuit may further store, in the memory, the s parameter values corresponding to the second data block, so that when detecting the next data block of the second data block, the frame boundary determining circuit may obtain, from the memory, the s parameter values corresponding to the second data block, and determine, according to the s parameter values corresponding to the second data block, s parameter values corresponding to the next data block, which is not limited in this embodiment.

Optionally, in another embodiment, the method 100 further includes: if a quantity of symbols included in the data is less than 2N, receiving new data, where the new data includes P consecutive symbols, the new data is adjacent to the N+P consecutive symbols and is received after the N+P consecutive symbols, N consecutive symbols with a third symbol in the second data block being a starting point constitute a third data block, and an offset of the third symbol relative to the second symbol is P symbols; if it is determined that the second symbol is not a frame boundary of an FEC frame, determining a first iterative item and a second iterative item of the third data block, where the first iterative item of the third data block is obtained according to the first P consecutive symbols in the second data block, and the second iterative item of the third data block is obtained according to the P consecutive symbols included in the new data; determining, according to the s parameter values corresponding to the second data block and the first iterative item and the second iterative item of the third data block, s parameter values corresponding to the third data block; and determining, according to the s parameter values corresponding to the third data block, whether the third symbol is a frame boundary of an FEC frame.

If the quantity of the symbols included in the data is less than 2N, the frame boundary determining circuit may continue to receive P consecutive symbols, and perform, in a unit of P symbols, sliding on a data block being detected, where the third data block is the next data block of the second data block. A location relationship between the third data block and the second data block is similar to the location relationship between the second data block and the first data block, and for brevity, details are not described herein again. A procedure of processing the third data block by the frame boundary determining circuit is similar to S120 to S140, and for brevity, details are not described herein again.

Optionally, in another embodiment, if each symbol includes a plurality of bits, or P is an integer greater than 1, the method 100 may further include: if a quantity of symbols included in the data is equal to 2N, receiving new data, where the new data includes a fourth data block, the fourth data block is constituted by N consecutive symbols with a fourth symbol being a starting point, the new data is not adjacent to the N+P consecutive symbols and is received after the N+P consecutive symbols, an offset of a starting bit of the fourth symbol relative to a starting bit $n_1$ of the second symbol is L symbols, Lmodm≠0, or Lmodm=0 and LmodP≠0, mod indicates a modulo operation, and m is a quantity of bits included in one symbol; if it is determined that the second symbol is not a frame boundary of an FEC frame, determining, according to the N consecutive symbols included in the fourth data block, s parameter values corresponding to the fourth data block; and determining, according to the s parameter values corresponding to the fourth data block, whether the fourth symbol is a frame boundary of an FEC frame.

If the quantity of the symbols included in the data is equal to 2N, and the N consecutive symbols in the second data block are last N consecutive symbols in the data, the frame boundary determining circuit has completed detection of Q symbols in the 2N symbols, where an offset between any two adjacent symbols in the Q detected symbols is P symbols. In this case, the frame boundary determining circuit may continue to receive 2N symbols, and execute a similar procedure to detect Q symbols in the 2N newly received symbols, where an offset between any two adjacent symbols in the Q to-be-detected symbols is P symbols. To avoid repetitive detection on a same symbol or bit, the frame boundary determining circuit may enable locations of the Q to-be-detected symbols in the 2N newly received symbols to slide by one or more symbols relative to locations of the Q detected symbols in the original 2N symbols, that is, a location of the $i^{th}$ to-be-detected symbol in the 2N newly received symbols slides by one or more symbols relative to a location of the $i^{th}$ detected symbol in the original 2N symbols, where 1≤i≤Q. Alternatively, locations of the Q to-be-detected symbols in the 2N newly received symbols are the same as locations of the Q detected symbols in the original 2N symbols, but a starting bit of the Q to-be-detected symbols slides by one or more bits relative to a starting bit of the Q detected symbols, that is, an offset of a starting bit of the $i^{th}$ to-be-detected symbol relative to a starting bit of the $i^{th}$ detected symbol is not an integer multiple of m, where m is a quantity of bits included in each symbol, which is not limited in this embodiment.

According to the method and the apparatus for determining a frame boundary of an FEC frame that are provided in the present embodiments, during a process of determining a frame boundary of an FEC frame, data of a maximum of 2×N×m²×P bits needs to be received (that is, N×m times of detection are required in total), which can increase a speed of locating an FEC frame by Q times compared with the prior art. An RS (N=528, k=514, m=10) code in which P=4 is used as an example. According to the method for determining a frame boundary of an FEC frame in this embodiment of the present embodiments, in a worst case, data of 20×5280×4 bits needs to be received, and a delay at a transmission rate of 25G is approximately 16.4 µs. However, if the solution in the prior art is used, a required synchronization time is approximately 2×5280×5280 bits, and a delay at the transmission rate of 25G is approximately 2.2 ms.

Therefore, according to the method for determining a frame boundary of an FEC frame in this embodiment, s parameter values corresponding to a second data block are determined by using s parameter values corresponding to a first data block, where the first data block is constituted by N consecutive symbols with a first symbol being a starting point, the second data block is constituted by N consecutive symbols with a second symbol being a starting point, and an offset of the second symbol relative to the first symbol is P symbols; and a frame boundary determining circuit determines, according to the s parameter values corresponding to the second data block, whether the second symbol is a frame boundary of an FEC frame. For each received 2N consecutive symbols, the frame boundary determining circuit can detect, by using an iterative algorithm, whether N/P symbols in the 2N consecutive symbols are a frame boundary of an FEC frame, thereby improving efficiency in determining a frame boundary of an FEC frame, increasing a synchronization speed of a communication link, and enhancing system performance.

A method for determining a frame boundary of an FEC frame according to an embodiment is described in detail in the following with reference to FIG. 4. A frame boundary determining circuit may first receive N consecutive symbols $r_{N-1}$ to $r_0$ with the symbol $r_{N-1}$ (hereinafter referred to as the first to-be-detected symbol) being a starting point, and the N consecutive symbols constitute current data and a first data block (or a current data block), to determine whether the first to-be-detected symbol is a frame boundary of an FEC frame. In this case, the current data does not include a previous data block of the first data block; therefore, the frame boundary determining circuit may determine, according to formula (1) or (2), s parameter values corresponding to the first data block, and determine, according to the s parameter values, whether the first to-be-detected symbol is a frame boundary of an FEC frame.

If the first to-be-detected symbol is a frame boundary of an FEC frame, a procedure of determining a frame boundary of an FEC frame ends. If the first to-be-detected symbol is not a frame boundary of an FEC frame, the frame boundary determining circuit may receive P consecutive symbols (symbols $r_{-1}$ to $r_{-P}$) adjacent to the current data (that is, the N consecutive symbols in the first data block), and update the current data to N+P consecutive symbols. Then, the frame boundary determining circuit uses N consecutive symbols (symbols $r_{N-P-1}$ to $r_{-P}$) with the second to-be-detected symbol (the symbol $r_{N-P-1}$) being a starting point as a second data block (a new current data block), and determines whether the second to-be-detected symbol in the new current data is a frame boundary of an FEC frame, where the second to-be-detected symbol (the symbol $r_{N-P-1}$) has a backward offset of P symbols, relative to the first to-be-detected symbol (the symbol $r_{N-1}$). In this case, the new current data includes a previous data block (that is, the first data block) of the second data block; therefore, the frame boundary determining circuit may determine, according to the s parameter values corresponding to the first data block, s parameter values corresponding to the second data block (that is, determine, according to s parameter values corresponding to the previous data block, s parameter values corresponding to the current data block), and determine, according to the s parameter values corresponding to the second data block, whether the second to-be-detected symbol is a frame boundary of an FEC frame.

If the frame boundary determining circuit determines that the second to-be-detected symbol is a frame boundary of an FEC frame, the procedure of determining a frame boundary of an FEC frame ends. If the frame boundary determining circuit determines that the second to-be-detected symbol is not a frame boundary of an FEC frame, the frame boundary determining circuit continues to receive P consecutive symbols adjacent to the new current data (that is, the N+P consecutive symbols), updates the current data to (N+2P) consecutive symbols, uses N consecutive symbols ($r_{N-2P-1}$ to $r_{-2P}$) with a third to-be-detected symbol being a starting point that are in the new current data as a third data block (a new current data block), and then determines, according to the s parameter values corresponding to the second data block, whether the third to-be-detected symbol is a frame boundary of an FEC frame, that is, determines, according to s parameter values corresponding to a previous data block of the new current data block, s parameter values corresponding to the new current data block, where the third to-be-detected symbol has a backward offset of P symbols, relative to the second to-be-detected symbol, and the rest can be deduced by analogy.

The frame boundary determining circuit may repeat the foregoing iterative process until a frame boundary of an FEC frame is detected or it is determined that none of Q to-be-detected symbols (that is, symbols $r_{N-1}$, $r_{N-P-1}$, ..., $r_{2P-1}$, and $r_{P-1}$) in 2N consecutive symbols is a frame boundary of an FEC frame. When each current data block is detected, the frame boundary determining circuit determines that N consecutive symbols with a first symbol being a starting point that are in the current data are a current data block, where N is a quantity of symbols included in one FEC frame, the currently received data includes a previous data block of the current data block, and the first symbol has a backward offset of P symbols, relative to a starting symbol of the previous data block, where 1≤P<N; determines s parameter values corresponding to the previous data block; determines a first iterative item and a second iterative item of the current data block, where the s parameter values are s values of a correction factor or s values of a verification factor, the first iterative item of the current data block is obtained according to first P symbols in the previous data block, the second iterative item of the current data block is obtained according to last P symbols in the current data block, and s≥1; determines, according to the s parameter values corresponding to the previous data block and the first iterative item and the second iterative item of the current data block, s parameter values corresponding to the current data block; and determines, according to the s parameter values corresponding to the current data block, whether the first symbol is a frame boundary of an FEC frame.

Optionally, in another embodiment, if the frame boundary determining circuit determines that the first symbol is not a frame boundary of an FEC frame, and a quantity of symbols included in the current data is less than 2N, the frame boundary determining circuit may receive P consecutive symbols adjacent to the current data, add the newly received P consecutive symbols to the current data, use the current data to which the newly received P consecutive symbols are added as new current data, and determine that N consecutive symbols with a second symbol being a starting point that are in the new current data are a new current data block, where the second symbol has a backward offset of P symbols, relative to the first symbol.

Optionally, in another embodiment, in the current data block, a first bit in the first symbol is specifically used as a starting point.

If it is determined that the first symbol is not a frame boundary of an FEC frame, and the current data includes 2N symbols, the frame boundary determining circuit may continue to receive N consecutive symbols; use the continuously received N consecutive symbols as new current data, where the continuously received N consecutive symbols are not adjacent to the 2N symbols; and determine that N consecutive symbols with a third symbol being a starting point that are in the new current data are a new current data block, where a starting bit of the first symbol is the first bit, a starting bit of the third symbol is a second bit, and a sequence number $n_2$ of the second bit and a sequence number $n_1$ of the first bit meet the following condition: $(n_2-n_1) \bmod m \neq 0$, or if $m>1$, and $P>1$, $(n_2-n_1) \bmod m = 0$, and $(n_2-n_1) \bmod P \neq 0$, where mod indicates a modulo operation, and m is a quantity of bits included in one symbol.

It should be understood that in the foregoing embodiment, an example in which a relative offset between two consecutive data blocks is P symbols and the frame boundary determining circuit receives data in a unit of P symbols is used for description. However, in the embodiments, a quantity of symbols of an offset between a former data block and a latter data block may not be equal to a quantity of symbols of data received each time, which is not limited in this embodiment.

Therefore, according to the method for determining a frame boundary of an FEC frame in this embodiment, s parameter values corresponding to a second data block are determined by using s parameter values corresponding to a first data block, where the first data block is constituted by N consecutive symbols with a first symbol being a starting point, the second data block is constituted by N consecutive symbols with a second symbol being a starting point, and an offset of the second symbol relative to the first symbol is P symbols; and a frame boundary determining circuit determines, according to the s parameter values corresponding to the second data block, whether the second symbol is a frame boundary of an FEC frame. For each received 2N consecutive symbols, the frame boundary determining circuit can detect, by using an iterative algorithm, whether N/P symbols in the 2N consecutive symbols are a frame boundary of an FEC frame, thereby improving efficiency in determining a frame boundary of an FEC frame, increasing a synchronization speed of a communication link, and enhancing system performance.

It should be noted that the example of FIG. 4 is merely intended to help a person skilled in the art better understand the embodiments, but is not intended to limit the scope of the embodiments. A person skilled in the art certainly can make various equivalent modifications or changes according to the example listed in FIG. 4, which also fall within the protection scope of the embodiments.

It should be understood that sequence numbers of the foregoing processes do not mean execution sequences. The execution sequences of the processes shall be determined according to functions and internal logic of the processes, and shall not be construed as any limitation on the implementation processes of the embodiments.

The method for determining a frame boundary of an FEC frame according to the embodiment is described in detail in the foregoing with reference to FIG. 1 to FIG. 4. An apparatus for determining a frame boundary of an FEC frame, and a decoding system according to the embodiments are described in the following with reference to FIG. 5 to FIG. 10.

Figure 5:
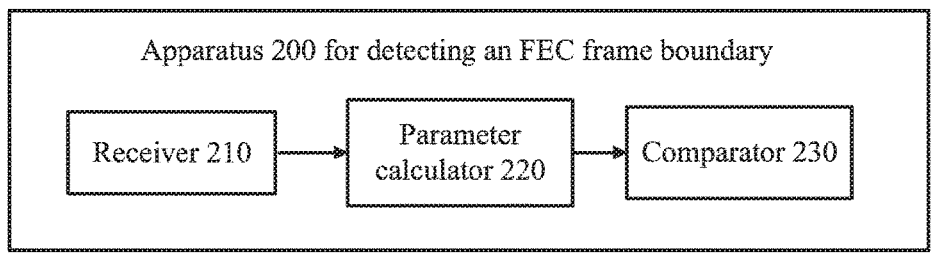
FIG. 5 is a schematic block diagram of an apparatus for determining a frame boundary of an FEC frame according to an embodiment.

FIG. 5 shows an apparatus 200 for determining a frame boundary of an FEC frame according to an embodiment. The apparatus 200 includes a receiver 210, a parameter calculator 220, and a comparator 230. The apparatus 200 may be used to execute the method shown in FIG. 2.

The receiver 210 is configured to receive data, where the data includes N+P consecutive symbols with a first symbol being a starting point, N is a quantity of symbols included in one FEC frame, N is a positive integer multiple of P, N is greater than P, N consecutive symbols with the first symbol being a starting point that are in the N+P consecutive symbols constitute a first data block, N consecutive symbols with a second symbol being a starting point that are in the N+P consecutive symbols constitute a second data block, and an offset of the second symbol relative to the first symbol is P symbols.

The parameter calculator 220 is configured to: obtain s parameter values corresponding to the first data block received by the receiver 210, determine a first iterative item and a second iterative item of the second data block received by the receiver 210, and determine, according to the s parameter values corresponding to the first data block and the first iterative item and the second iterative item of the second data block, s parameter values corresponding to the second data block, where the first iterative item of the second data block is obtained according to first P consecutive symbols in the first data block, and the second iterative item of the second data block is obtained according to last P consecutive symbols in the second data block.

The comparator 230 is configured to determine, according to the s parameter values that are corresponding to the second data block and obtained by the parameter calculator 220, whether the second symbol is a frame boundary of an FEC frame.

Therefore, according to the apparatus for determining a frame boundary of an FEC frame in this embodiment, s parameter values corresponding to a second data block are determined by using s parameter values corresponding to a first data block, where the first data block is constituted by N consecutive symbols with a first symbol being a starting point, the second data block is constituted by N consecutive symbols with a second symbol being a starting point, and an offset of the second symbol relative to the first symbol is P symbols; and a frame boundary determining circuit determines, according to the s parameter values corresponding to the second data block, whether the second symbol is a frame boundary of an FEC frame. For received 2N consecutive symbols, the frame boundary determining circuit can detect, by using an iterative algorithm, whether N/P symbols in the 2N consecutive symbols are a frame boundary of an FEC frame, thereby improving efficiency in determining a frame boundary of an FEC frame, increasing a synchronization speed of a communication link, and enhancing system performance.

The parameter calculator 220 may further be configured to: when the first data block is detected, calculate the s parameter values corresponding to the first data block; the comparator 230 is further configured to determine, according to the s parameter values that are corresponding to the first data block and determined by the parameter calculator 220, that the first symbol is not a frame boundary of an FEC frame. Optionally, the first symbol may be the first to-be-detected symbol in the data, that is, current data does not include a previous data block of the first data block; or the first symbol may be a middle to-be-detected symbol in current data, that is, the current data includes a previous data block of the first data block, which is not limited in this embodiment.

In this embodiment, P may be a positive integer greater than or equal to 1. For example, P is a degree of parallelism of an FEC codec, that is, a quantity of parameter values that can be accommodated by an actual data channel of the FEC codec, which is not limited in this embodiment. The s parameter values may be s values of a correction factor or s values of a verification factor. If the s parameter values are the s values of the verification factor, s=1; if the s parameter values are the s values of the correction factor, s may be less than or equal to 2t, where t is a maximum quantity of error symbols that can be corrected in one FEC frame. Generally, a larger value of s indicates higher accuracy of detecting a frame boundary but more consumed circuit resources. Therefore, a value of s may be determined according to an actual accuracy requirement and actual resource consumption, for example, s=P, which is not limited in this embodiment.

Optionally, the s parameter values corresponding to the first data block are s values of a correction factor, the s parameter values corresponding to the second data block are s values of a correction factor, and the first iterative item and the second iterative item of the second data block are determined by using the following formula:

$$H(a) = \sum_{j=0}^{P-1} r(j) \times a^j, \quad (15)$$

where a is a constant, and r(j) indicates the $j^{th}$ symbol in the first P consecutive symbols or the $j^{th}$ symbol in the last P consecutive symbols.

Optionally, in another embodiment, the s parameter values corresponding to the first data block are s values of a verification factor, the s parameter values corresponding to the second data block are s values of a verification factor, and the first iterative item and the second iterative item of the second data block are determined by using the following formula:

$$H(a) = \sum_{j=0}^{P-1} r(j) \times a^{n(j)}, \quad (16)$$

where a is a variable, r(j) indicates the $j^{th}$ symbol in the first P consecutive symbols or the $j^{th}$ symbol in the last P consecutive symbols, and n(j) indicates a sequence number of the $j^{th}$ symbol.

In this case, a may be specifically x in a generator polynomial g(x).

The first iterative item of the second data block may be obtained by substituting the first P consecutive symbols in the first data block into the formula H(a), and the second iterative item of the second data block may be obtained by substituting the last P consecutive symbols in the second data block into the formula H(a).

Optionally, in another embodiment, the apparatus 200 further includes a memory. The memory is configured to store the first P consecutive symbols in the first data block; correspondingly, the parameter calculator 220 is specifically configured to: obtain the first P consecutive symbols in the first data block that are stored in the memory, and determine the first iterative item of the second data block according to the first P consecutive symbols in the first data block and the formula H(a); or the memory is configured to store the first iterative item of the second data block; correspondingly, the parameter calculator 220 is specifically configured to obtain the first iterative item that is of the second data block and is stored in the memory.

Optionally, in another embodiment, if the second symbol is not the $Q^{th}$ to-be-detected symbol in the current data, the memory may further store first P consecutive symbols in the second data block, so that when a next data block of the second data block is detected, a first iterative item of the next data block of the second data block is determined according to the first P consecutive symbols in the second data block.

Optionally, in another embodiment, the parameter calculator 220 may further be configured to substitute the first P consecutive symbols in the second data block into the formula H(a) to obtain the first iterative item of the next data block of the second data block, where a starting symbol of the next data block has a backward offset of P symbols, relative to the second symbol. Correspondingly, the memory is further configured to store the first iterative item that is of the next data block of the second data block and is obtained by the parameter calculator 220. In this way, when the next data block of the second data block is detected, the parameter calculator 220 may obtain the first iterative item that is of the next data block and is stored in the memory.

In this embodiment, the memory may be specifically implemented in a form of a register or a static random access memory (RAM). For example, the apparatus 200 for determining a frame boundary of an FEC frame may include both a register and a static RAM, where the register is configured to register the s parameter values corresponding to the first data block, or is further configured to register the first iterative item of the second data block, and the static RAM is configured to store current data, which is not limited in this embodiment.

Optionally, in another embodiment, if the s parameter values corresponding to the first data block are the s values of the correction factor, and the s parameter values corresponding to the second data block are the s values of the correction factor, 1<s≤2×t, where t is a maximum quantity of error symbols that can be corrected in one FEC frame, and the first iterative item and the second iterative item each include s values.

Correspondingly, the parameter calculator 220 is specifically configured to determine, according to the following formula, the s values of the correction factor corresponding to the second data block:

$$S_{current,i} = S_{previous,i} \times (\alpha_i)^P + H_1(\alpha_i) \times (\alpha_i)^N + H_2(\alpha_i) \quad 1 \le i \le s \quad (17),$$

where $S_{current,i}$ is the $i^{th}$ value of the correction factor corresponding to the second data block, $S_{previous,i}$ is the $i^{th}$ value of the correction factor corresponding to the first data block, $H_1(\alpha_i)$ is the $i^{th}$ value of the first iterative item of the second data block, $H_2(\alpha_i)$ is the $i^{th}$ value of the second iterative item of the second data block, and $\alpha_i$ is the $i^{th}$ root of a generator polynomial of an FEC code.

In this case, values of the first iterative item and the second iterative item may be determined by using formula (15).

Optionally, in another embodiment, if the s parameter values corresponding to the first data block are the s values of the verification factor, and the s parameter values corresponding to the second data block are the s values of the verification factor, s=1, and the parameter calculator 220 is specifically configured to determine, according to the following formula, a value of the verification factor corresponding to the second data block:

$$R_{current} = (R_{previous} \times x^P) \bmod g(x) + (H_1(x) \times x^P) \bmod g(x) + (H_2(x) \times x^P) \bmod g(x) \quad (18),$$

where $R_{current}$ is the value of the verification factor corresponding to the second data block, $R_{last}$ is a value of the verification factor corresponding to the first data block, $H_1(x)$ is the first iterative item of the second data block, $H_2(x)$ is the second iterative item of the second data block, and g(x) is a generator polynomial of an FEC code.

In this case, values of the first iterative item and the second iterative item may be determined by using formula (16).

Optionally, in another embodiment, the comparator 230 is specifically configured to: if the s parameter values that are corresponding to the second data block and determined by the parameter calculator 220 are all 0, determine that the second symbol is a frame boundary of an FEC frame; or if at least one parameter value in the s parameter values that are corresponding to the second data block and determined by the parameter calculator 220 is not equal to 0, determine that the second symbol is not a frame boundary of an FEC frame.

Optionally, in another embodiment, the receiver 210 is further configured to: if a quantity of symbols included in the data is less than 2N, receive new data, where the new data includes P consecutive symbols, the new data is adjacent to the N+P consecutive symbols and is received after the N+P consecutive symbols, N consecutive symbols with a third symbol in the second data block being a starting point constitute a third data block, and an offset of the third symbol relative to the second symbol is P symbols.

The parameter calculator 220 is further configured to: if the comparator 230 determines that the second symbol is not a frame boundary of an FEC frame, determine a first iterative item and a second iterative item of the third data block, where the first iterative item of the third data block is obtained according to the first P consecutive symbols in the second data block, and the second iterative item of the third data block is obtained according to the P consecutive symbols included in the new data; and determine, according to the s parameter values corresponding to the second data block and the first iterative item and the second iterative item of the third data block, s parameter values corresponding to the third data block.

The comparator 230 is further configured to determine, according to the s parameter values that are corresponding to the third data block and determined by the parameter calculator 220, whether the third symbol is a frame boundary of an FEC frame.

Optionally, in another embodiment, the receiver 210 is further configured to: if a quantity of symbols included in the data is equal to 2N, receive new data, where the new data includes a fourth data block, the fourth data block is constituted by N consecutive symbols with a fourth symbol being a starting point, the new data is not adjacent to the N+P consecutive symbols and is received after the N+P consecutive symbols, an offset of a starting bit of the fourth symbol relative to a starting bit of the second symbol is L symbols, Lmodm≠0, or Lmodm=0 and LmodP≠0, mod indicates a modulo operation, and m is a quantity of bits included in one symbol.

The parameter calculator 220 is further configured to: if the comparator 230 determines that the second symbol is not a frame boundary of an FEC frame, determine, according to the N consecutive symbols included in the fourth data block, s parameter values corresponding to the fourth data block.

The comparator 230 is further configured to determine, according to the s parameter values that are corresponding to the fourth data block and determined by the parameter calculator 220, whether the fourth symbol is a frame boundary of an FEC frame.

In this embodiment, if the comparator 230 determines that none of Q to-be-detected symbols in current data is a frame boundary of an FEC frame, the apparatus 200 may continue to perform detection of a frame boundary in a unit of 2N consecutive symbols. The apparatus 200 may execute the foregoing determining process by first performing an offset in a unit of one or more bits, that is, $(n_2-n_1)$modm≠0. If the apparatus 200 still does not detect a frame boundary of an FEC frame after performing a bit offset, the apparatus 200 continues to execute the foregoing detection process by performing an offset in a unit of one or more symbols, that is, $(n_2-n_1)$modm=0, and $(n_2-n_1)$modP≠0. Alternatively, the apparatus 200 may first perform an offset in a unit of one or more symbols, and then perform an offset in a unit of one or more bits, which is not limited in this embodiment.

The apparatus 200 for determining a frame boundary of an FEC frame according to this embodiment may be corresponding to the frame boundary determining circuit in the method for determining a frame boundary of an FEC frame according to the embodiment, and the foregoing and other operations and/or functions of the modules in the apparatus 200 for determining a frame boundary of an FEC frame are used to implement corresponding procedures of the methods in FIG. 2 to FIG. 4. For brevity, details are not described herein again.

Therefore, according to the apparatus for determining a frame boundary of an FEC frame in this embodiment, s parameter values corresponding to a second data block are determined by using s parameter values corresponding to a first data block, where the first data block is constituted by N consecutive symbols with a first symbol being a starting point, the second data block is constituted by N consecutive symbols with a second symbol being a starting point, and an offset of the second symbol relative to the first symbol is P symbols; and a frame boundary determining circuit determines, according to the s parameter values corresponding to the second data block, whether the second symbol is a frame boundary of an FEC frame. For received 2N consecutive symbols, the frame boundary determining circuit can detect, by using an iterative algorithm, whether N/P symbols in the 2N consecutive symbols are a frame boundary of an FEC frame, thereby improving efficiency in determining a frame boundary of an FEC frame, increasing a synchronization speed of a communication link, and enhancing system performance.

Figure 6:
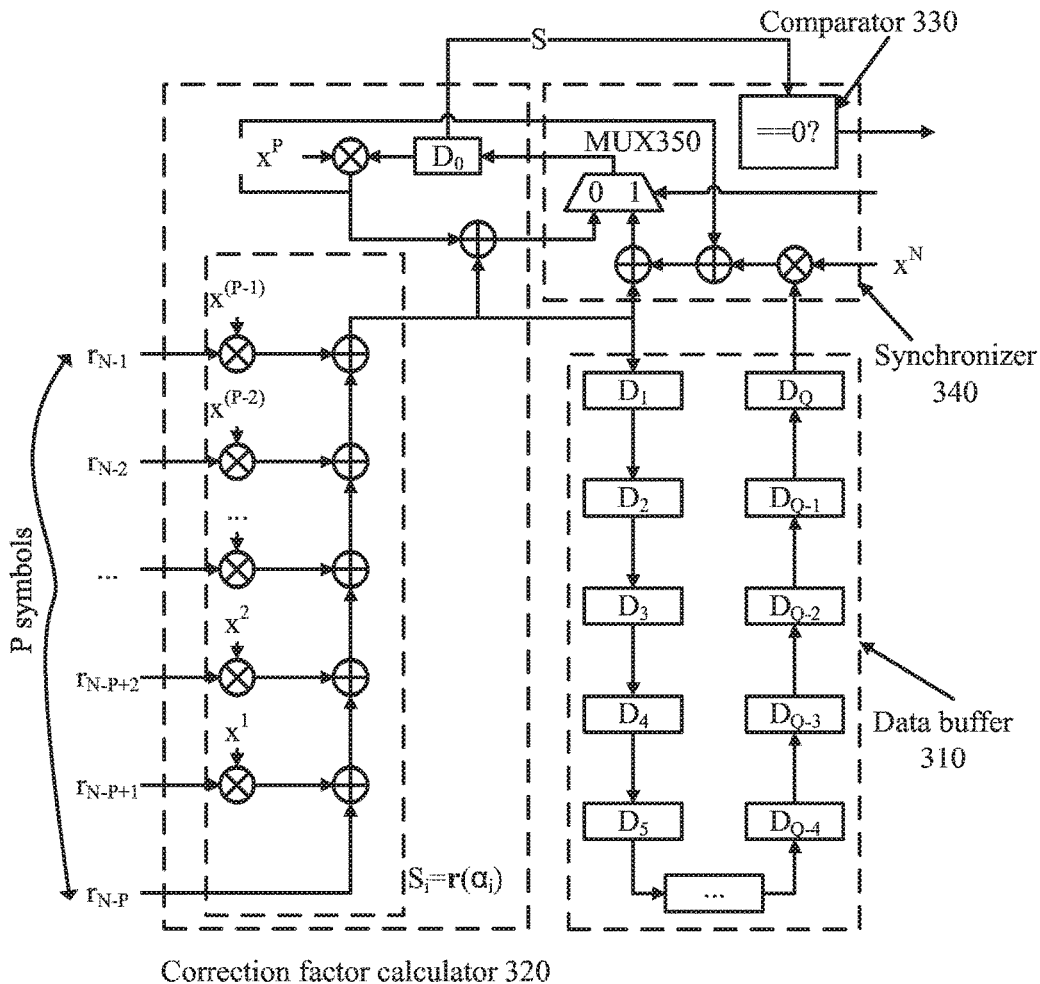
FIG. 6 is a schematic diagram of an example of an apparatus for determining a frame boundary of an FEC frame according to an embodiment.

FIG. 6 shows a specific implementation example of an apparatus 300 for determining a frame boundary of an FEC frame according to an embodiment. The apparatus 300 includes a data buffer 310, a correction factor calculator 512, a comparator 330, a synchronizer 340, and a multiplexer (MUX) 350.

The correction factor calculator 512 is configured to: use a first data block in current data as a current data block, and calculate and store s values of a correction factor corresponding to the first data block, where in the first data block, a first symbol (that is, the first to-be-detected symbol) in the current data is used as a starting point.

The comparator 330 is configured to determine, according to whether the s values of the correction factor corresponding to the first data block are all 0, whether the first to-be-detected symbol is a frame boundary of an FEC frame.

If the comparator 330 determines that the first to-be-detected symbol is not a frame boundary of an FEC frame, the multiplexer MUX 350 is switched from an initial state 0 to a state 1. In this case, a transmission link between the correction factor calculator 512 and the synchronizer 513 is changed from a connected state to a disconnected state, and at the same time, a transmission link between the data buffer 511 and the synchronizer 513 is changed from a disconnected state to a connected state.

In this case, a next data block (that is, a second data block) of the first data block is used as a new current data block, where a starting symbol of the second data block has a backward offset of P symbols, relative to the first to-be-detected symbol. In the following description, generally, the second data block is referred to as the $i^{th}$ data block, where $1 < i \leq Q$.

The correction factor calculator 512 is further configured to calculate a first iterative item and a second iterative item of the $i^{th}$ data block.

The data buffer 511 is configured to store the first iterative item that is of the $i^{th}$ data block and is determined by the correction factor calculator 512.

The correction factor calculator 512 is further configured to: calculate the second iterative item of the $i^{th}$ data block, and transmit the second iterative item of the $i^{th}$ data block to the synchronizer 513.

Correspondingly, the correction factor calculator 512 is further configured to transmit, to the synchronizer 513, previously-stored s values of a correction factor corresponding to the $(i-1)^{th}$ data block.

The synchronizer 513 is configured to: obtain, from the correction factor calculator 512, the s values of the correction factor corresponding to the $(i-1)^{th}$ data block, obtain the second iterative item of the $i^{th}$ data block from the correction factor calculator 512, obtain the first iterative item of the $i^{th}$ data block from the data buffer 511, and calculate, according to the s values of the correction factor corresponding to the $(i-1)^{th}$ data block and the second iterative item of the $i^{th}$ data block that are obtained from the correction factor calculator 512 and the first iterative item that is of the $i^{th}$ data block and is obtained from the data buffer 511, s values of a correction factor corresponding to the $i^{th}$ data block.

The comparator 330 is further configured to determine, according to the s values of the correction factor corresponding to the $i^{th}$ data block, whether a starting symbol of the $i^{th}$ data block is a frame boundary of an FEC frame.

The correction factor calculator 512 is further configured to store the s values that are of the correction factor corresponding to $i^{th}$ data block and are determined by the synchronizer 340.

If the comparator 330 determines that the starting symbol of the $i^{th}$ data block is not a frame boundary of an FEC frame, a next data block (that is, the $(i+1)^{th}$ data block) of the $i^{th}$ data block is used as a new second data block, and the rest can be deduced by analogy.

Optionally, the correction factor calculator 512 and the synchronizer 513 may be implemented by a summator and a multiplier, which is not limited in this embodiment.

Therefore, according to the apparatus for determining a frame boundary of an FEC frame in this embodiment, s parameter values corresponding to a second data block are determined by using s parameter values corresponding to a first data block, where the first data block is constituted by N consecutive symbols with a first symbol being a starting point, the second data block is constituted by N consecutive symbols with a second symbol being a starting point, and an offset of the second symbol relative to the first symbol is P symbols; and a frame boundary determining circuit determines, according to the s parameter values corresponding to the second data block, whether the second symbol is a frame boundary of an FEC frame. For received 2N consecutive symbols, the frame boundary determining circuit can detect, by using an iterative algorithm, whether N/P symbols in the 2N consecutive symbols are a frame boundary of an FEC frame, thereby improving efficiency in determining a frame boundary of an FEC frame, increasing a synchronization speed of a communication link, and enhancing system performance.

Figure 7:
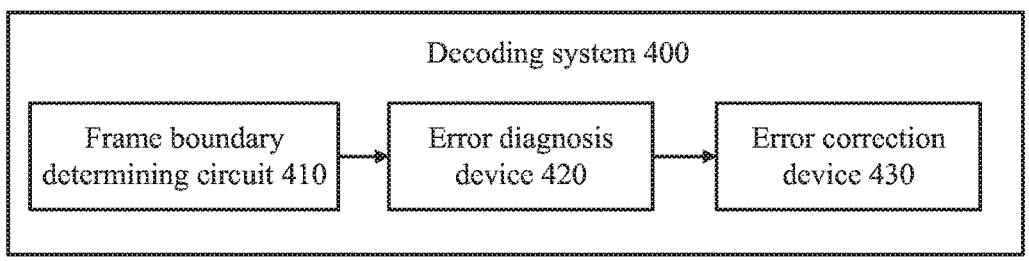
FIG. 7 is a schematic block diagram of a decoding system according to an embodiment.

FIG. 7 schematically shows a decoding system 400 according to an embodiment. The decoding system 400 includes a frame boundary determining circuit 410, an error diagnosis device 420, and an error correction device 430, where the frame boundary determining circuit 410 is configured to determine a frame boundary of an FEC code, the error diagnosis device 420 is configured to determine, according to the frame boundary determined by the frame boundary determining circuit 410, an error that exists in an FEC frame, the error correction device 430 is configured to perform error correction on the FEC frame according to the error that exists in the FEC frame and is determined by the error diagnosis device 420, and the frame boundary determining circuit 410 is specifically configured to: receive data, where the data includes N+P consecutive symbols with a first symbol being a starting point, N is a quantity of symbols included in one FEC frame, N is a positive integer multiple of P, N is greater than P, N consecutive symbols with the first symbol being a starting point that are in the N+P consecutive symbols constitute a first data block, N consecutive symbols with a second symbol being a starting point that are in the N+P consecutive symbols constitute a second data block, and an offset of the second symbol relative to the first symbol is P symbols; obtain s parameter values corresponding to the first data block, where the s parameter values are s values of a correction factor or s values of a verification factor, and s 1; determine a first iterative item and a second iterative item of the second data block, where the first iterative item of the second data block is obtained according to first P consecutive symbols in the first data block, and the second iterative item of the second data block is obtained according to last P consecutive symbols in the second data block; determine, according to the s parameter values corresponding to the first data block and the first iterative item and the second iterative item of the second data block, s parameter values corresponding to the second data block; and determine, according to the s parameter values corresponding to the second data block, whether the second symbol is a frame boundary of an FEC frame.

Optionally, the decoding system 400 may further include a descrambler, configured to perform descrambling on a to-be-processed data stream. Correspondingly, the error correction device 430 is specifically configured to perform, according to the error that exists in the FEC frame and is determined by the error diagnosis device 420, error correction on an FEC frame descrambled by the descrambler.

Optionally, in another embodiment, the decoding system 400 may further include a controller, configured to: if a result of the determining by the frame boundary determining circuit 410 indicates that the second symbol is not a frame boundary of an FEC frame, control the frame boundary determining circuit 410 to continue to determine a frame boundary; or if the result of the determining by the frame boundary determining circuit 410 indicates that the second symbol is a frame boundary of an FEC frame, control the error diagnosis device 420 to determine, according to the frame boundary determined by the frame boundary determining circuit 410, the error that exists in the FEC frame.

The frame boundary determining circuit 410 according to this embodiment may be corresponding to the frame boundary determining circuit in the method for determining a frame boundary of an FEC frame according to the embodiment, or may be corresponding to the apparatus for determining a frame boundary of an FEC frame according to the embodiment, and the foregoing and other operations and/or functions of the modules in the frame boundary determining circuit 410 are used to implement corresponding procedures of the methods in FIG. 2 to FIG. 4. For brevity, details are not described herein again.

Therefore, according to the decoding system in this embodiment, s parameter values corresponding to a second data block are determined by using s parameter values corresponding to a first data block, where the first data block is constituted by N consecutive symbols with a first symbol being a starting point, the second data block is constituted by N consecutive symbols with a second symbol being a starting point, and an offset of the second symbol relative to the first symbol is P symbols; and a frame boundary determining circuit determines, according to the s parameter values corresponding to the second data block, whether the second symbol is a frame boundary of an FEC frame. For received 2N consecutive symbols, the frame boundary determining circuit can detect, by using an iterative algorithm, whether N/P symbols in the 2N consecutive symbols are a frame boundary of an FEC frame, thereby improving efficiency in determining a frame boundary of an FEC frame, increasing a synchronization speed of a communication link, and enhancing system performance.

Figure 8:
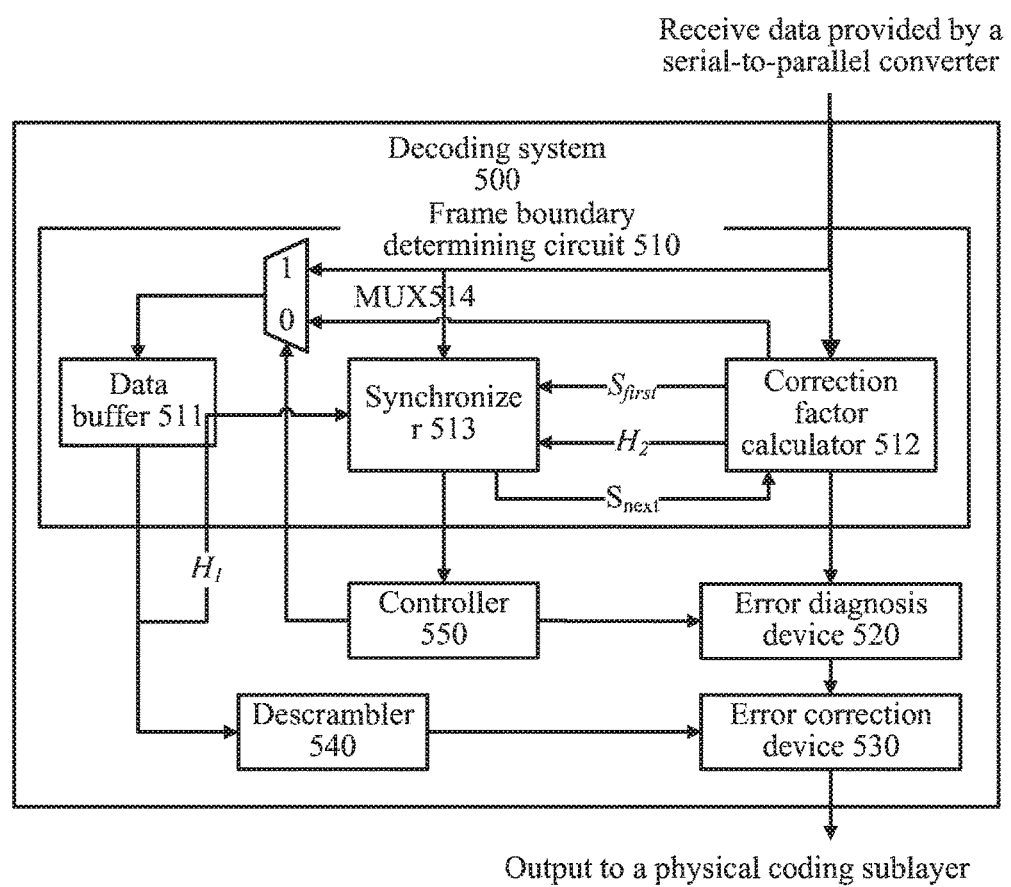
FIG. 8 is a schematic diagram of an example of a decoding system according to an embodiment.
Figure 9:
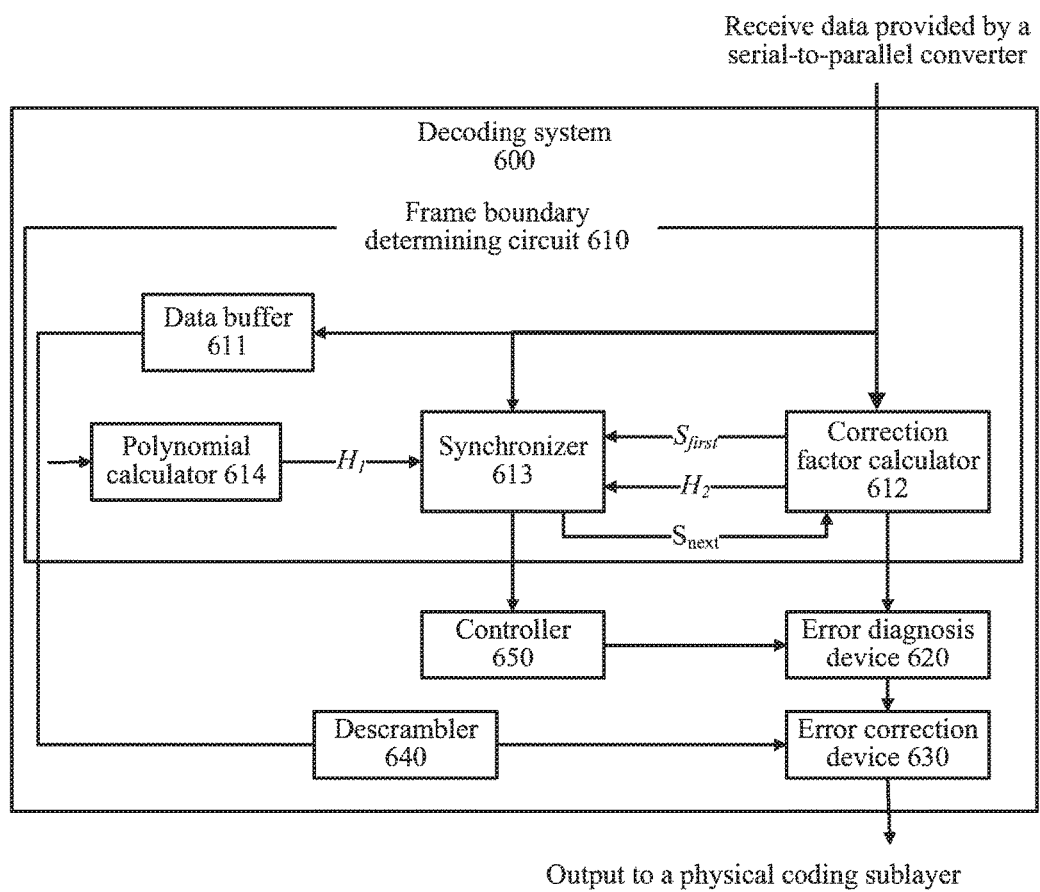
FIG. 9 is a schematic diagram of another example of a decoding system according to an embodiment.

FIG. 8 and FIG. 9 show two examples of a decoding system according to embodiments. In a decoding system 500 shown in FIG. 8 and a decoding system 600 shown in FIG. 9, s parameter values are s values of a correction factor. As shown in FIG. 8, the decoding system 500 includes a frame boundary determining circuit 510, an error diagnosis device 520, an error correction device, a descrambler 540, and a controller 550, where the frame boundary determining circuit 510 includes a data buffer 511, a correction factor calculator 512, a synchronizer 513, and a multiplexer (MUX) 514.

The controller 550 may control a status of the multiplexer 514. When the frame boundary determining circuit 510 performs determining of a frame boundary of an FEC frame, the controller 550 sets the multiplexer 514 to 0, and when the frame boundary determining circuit 510 determines a frame boundary of an FEC frame, the controller sets the multiplexer 514 to 1, which is not limited in this embodiment.

Functions of other modules in the frame boundary determining circuit 510 are similar to functions of corresponding modules in the apparatus 300 for determining a frame boundary of an FEC frame shown in FIG. 6. Specifically, the correction factor calculator 512 is configured to calculate and store s values ($S_{first}$) of a correction factor corresponding to a first data block in current data, where in the first data block, a first symbol in the current data is used as a starting bit. The comparator 330 is configured to determine, according to whether the s values of the correction factor corresponding to the first data block are all 0, whether the first symbol is a frame boundary of an FEC frame.

If the comparator 330 determines that the first symbol is not a frame boundary of an FEC frame, a next data block (that is, a second data block) of the first data block is used as a new current data block.

The correction factor calculator 512 is further configured to calculate a first iterative item and a second iterative item of the $i^{th}$ data block, where $1 < i \leq Q$.

The data buffer 511 is configured to store the first iterative item that is of the $i^{th}$ data block and is determined by the correction factor calculator 512.

The synchronizer 513 is configured to calculate, according to s values of a correction factor corresponding to the $(i-1)^{th}$ data block and the second iterative item ($H_2$) of the $i^{th}$ data block that are obtained from the correction factor calculator 512 and the first iterative item ($H_1$) that is of the $i^{th}$ data block and is obtained from the data buffer 511, s values ($S_{next}$) of a correction factor corresponding to the $i^{th}$ data block.

The comparator 330 is further configured to determine, according to the s values of the correction factor corresponding to the $i^{th}$ data block, whether a starting symbol of the $i^{th}$ data block is a frame boundary of an FEC frame.

The correction factor calculator 512 is further configured to store the s values that are of the correction factor corresponding to the $i^{th}$ data block and are determined by the synchronizer 513, so that the synchronizer 513 determines, according to the s values of the correction factor corresponding to the $i^{th}$ data block, s values of a correction factor corresponding to the $(i+1)^{th}$ data block.

A structure of a decoding system 600 shown in FIG. 9 is similar to that of the decoding system 500 shown in FIG. 8, and a main difference lies in that a structure of a frame boundary determining circuit 610 is different from that of the frame boundary determining circuit 510. Specifically, in the frame boundary determining circuit 510, the correction factor calculator 512 calculates the first iterative item $H_1$ of the $i^{th}$ data block in advance, and stores the first iterative item $H_1$ of the $i^{th}$ data block in the data buffer 511. In this way, when calculating a value of the correction factor corresponding to the $i^{th}$ data block, the synchronizer 513 may obtain $H_1$ stored in the data buffer 511, without requiring real-time calculation.

In the frame boundary determining circuit 610, a data buffer 611 is not configured to store the first iterative item of the $i^{th}$ data block, but is configured to store first P consecutive symbols in the $(i-1)^{th}$ data block. In this case, when a synchronizer 613 needs to calculate the value of the correction factor $S_{next}$ corresponding to the $i^{th}$ data block, a polynomial calculator 614 calculates the first iterative item $H_1$ of the $i^{th}$ data block in real time according to the first P consecutive symbols in the $(i-1)^{th}$ data block that are stored in the data buffer 611, and inputs a calculation result to the synchronizer 613.

Figure 10:
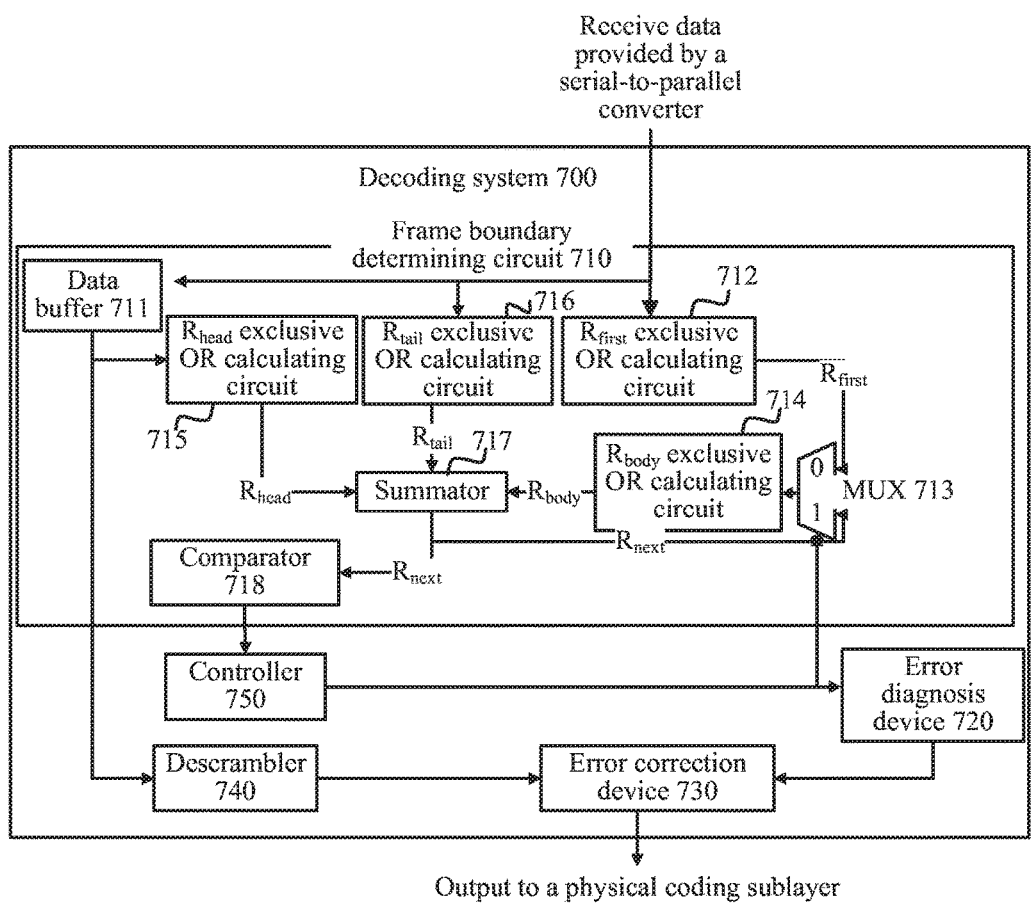
FIG. 10 is a schematic diagram of still another example of a decoding system according to an embodiment.

FIG. 10 shows an example of another decoding system 700 according to an embodiment, where s parameter values are values of a verification factor. It can be learned from formula (16) that a value of a verification factor corresponding to a next data block may be determined by using the following formulas:

$$R_{next} = R_{head} + R_{body} + R_{tail} \qquad (19)$$

$$R_{body} = [R_{current} \cdot x^P] \bmod g(x) \qquad (20)$$

$$R_{head} = H_1 \bmod g(x) \qquad (21)$$

$$R_{tail} = H_2 \bmod g(x). \qquad (22)$$

Correspondingly, a frame boundary determining circuit 710 includes a data buffer 711, an $R_{first}$ exclusive OR calculating circuit 712, a multiplexer 713, an $R_{body}$ exclusive OR calculating circuit 714, an $R_{head}$ exclusive OR calculating circuit 715, an $R_{tail}$ exclusive OR calculating circuit 716, a summator 717, and a comparator 718.

The $R_{first}$ exclusive OR calculating circuit 712 is configured to calculate a value of a verification factor $R_{first}$ corresponding to a first data block, and the comparator 718 is configured to determine, according to the $R_{first}$ value determined by the $R_{first}$ exclusive OR calculating circuit 712, whether a starting symbol of the first data block is a frame boundary of an FEC frame.

If the comparator 718 determines that the starting symbol of the first data block is not a frame boundary of an FEC frame, the $R_{body}$ exclusive OR calculating circuit 714 substitutes the $R_{first}$ value determined by the $R_{first}$ exclusive OR calculating circuit 712 into formula (20) to obtain an $R_{body}$ value of a next data block (hereinafter referred to as a second data block) of the first data block, where a starting symbol of the second data block has a backward offset of P symbols, relative to the starting symbol of the first data block.

Then, the MUX 713 is switched from an initial state 0 to a state 1. In this case, a transmission link between the $R_{first}$ exclusive OR calculating circuit 712 and the $R_{body}$ exclusive OR calculating circuit 714 is changed from a connected state to a disconnected state, and at the same time, a transmission link between the $R_{body}$ exclusive OR calculating circuit 714 and the summator 717 is changed from a disconnected state to a connected state.

In the following description, generally, the second data block is referred to as the $i^{th}$ data block, where $1 < i \leq Q$.

The $R_{head}$ exclusive OR calculating circuit 715 substitutes first P consecutive symbols in the $(i-1)^{th}$ data block into formula (21) to calculate an $R_{head}$ value of the $i^{th}$ data block, and the $R_{tail}$ exclusive OR calculating circuit 716 substitutes last P consecutive symbols in the $i^{th}$ data block into formula (22) to calculate an $R_{tail}$ value of the $i^{th}$ data block. Then, the $R_{body}$, and $R_{tail}$ values are all input into the summator 717.

The summator 717 executes an adding operation on the input $R_{body}$, $R_{head}$, and $R_{tail}$ values to obtain a value of a verification factor $R_{next}$ corresponding to the $i^{th}$ data block.

The comparator 718 determines, according to the $R_{next}$ value, whether a starting symbol of the $i^{th}$ data block is a frame boundary of an FEC frame.

If the comparator 718 determines that the starting symbol of the $i^{th}$ data block is not a frame boundary of an FEC frame, the frame boundary determining circuit 710 continues to perform iterative calculation to determine whether a starting symbol of a next data block (the $(i+1)^{th}$ data block) of the $i^{th}$ data block is a frame boundary of an FEC frame. That is, the $R_{body}$ exclusive OR calculating circuit 714 substitutes the $R_{next}$ value determined by the summator 771 into formula (18) to obtain an $R_{body}$ value of the $(i+1)^{th}$ data block; the $R_{head}$ exclusive OR calculating circuit 715 substitutes first P consecutive symbols in the $i^{th}$ data block into formula (21) to obtain an $R_{head}$ value of the $(i+1)^{th}$ data block; the $R_{tail}$ exclusive OR calculating circuit 716 substitutes last P consecutive symbols in the $(i+1)^{th}$ data block into formula (22) to obtain an $R_{tail}$ value of the $(i+1)^{th}$ data block; finally, the summator determines, according to the $R_{body}$, $R_{head}$, and $R_{tail}$ values of the $(i+1)^{th}$ data block, a value of a verification factor corresponding to the $(i+1)^{th}$ data block.

Therefore, according to the decoding system in this embodiment, s parameter values corresponding to a second data block are determined by using s parameter values corresponding to a first data block, where the first data block is constituted by N consecutive symbols with a first symbol being a starting point, the second data block is constituted by N consecutive symbols with a second symbol being a starting point, and an offset of the second symbol relative to the first symbol is P symbols; and a frame boundary determining circuit determines, according to the s parameter values corresponding to the second data block, whether the second symbol is a frame boundary of an FEC frame. For received 2N consecutive symbols, the frame boundary determining circuit can detect, by using an iterative algorithm, whether N/P symbols in the 2N consecutive symbols are a frame boundary of an FEC frame, thereby improving efficiency in determining a frame boundary of an FEC frame, increasing a synchronization speed of a communication link, and enhancing system performance.

It should be noted that the examples of FIG. 6, and FIG. 8 to FIG. 10 are merely intended to help a person skilled in the art better understand the embodiments, but are not intended to limit the scope of the embodiments. A person skilled in the art certainly can make various equivalent modifications or changes according to the examples listed in FIG. 6, and FIG. 8 to FIG. 10, which also fall within the protection scope.

An embodiment further provides an apparatus for determining a frame boundary of a forward error correction frame. The apparatus may be used to execute the method shown in FIG. 2. For example, the apparatus may be a frame boundary determining circuit. For meanings and examples of technical terms involved in the following, refer to the embodiment corresponding to FIG. 2. Details are not described herein again. The apparatus includes: a receiving unit, configured to receive data, where the data includes N+P consecutive symbols with a first symbol being a starting point, N is a quantity of symbols included in one FEC frame, N is a positive integer multiple of P, N is greater than P, N consecutive symbols with the first symbol being a starting point that are in the N+P consecutive symbols constitute a first data block, N consecutive symbols with a second symbol being a starting point that are in the N+P consecutive symbols constitute a second data block, and an offset of the second symbol relative to the first symbol is P symbols; an obtaining unit, configured to obtain s parameter values corresponding to the first data block; a first determining unit, configured to determine a first iterative item and a second iterative item of the second data block received by the receiving unit, where the first iterative item of the second data block is obtained according to first P consecutive symbols in the first data block, and the second iterative item of the second data block is obtained according to last P consecutive symbols in the second data block; a second determining unit, configured to determine, according to the s parameter values that are corresponding to the first data block and obtained by the obtaining unit and the first iterative item and the second iterative item of the second data block that are determined by the first determining unit, s parameter values corresponding to the second data block; and a third determining unit, configured to determine, according to the s parameter values that are corresponding to the second data block and determined by the second determining unit, whether the second symbol is a frame boundary of an FEC frame.

Optionally, the s parameter values corresponding to the first data block are s values of a correction factor, the s parameter values corresponding to the second data block are s values of a correction factor, and the first iterative item and the second iterative item of the second data block are determined by using the following formula:

$$H(a) = \sum_{j=0}^{P-1} r(j) \times a^j, \quad (23)$$

where a is a constant, and r(j) indicates the $j^{th}$ symbol in the first P consecutive symbols or the $j^{th}$ symbol in the last P consecutive symbols.

Optionally, in another embodiment, the s parameter values corresponding to the first data block are s values of a verification factor, the s parameter values corresponding to the second data block are s values of a verification factor, and the first iterative item and the second iterative item of the second data block are determined by using the following formula:

$$H(a) = \sum_{j=0}^{P-1} r(j) \times a^{n(j)}, \tag{24}$$

where a is a variable, r(j) indicates the $j^{th}$ symbol in the first P consecutive symbols or the $j^{th}$ symbol in the last P consecutive symbols, and n(j) indicates a sequence number of the $j^{th}$ symbol.

Optionally, in another embodiment, the apparatus further includes a storage unit, where: the storage unit is configured to store the first P consecutive symbols in the first data block; and the first determining unit is specifically configured to: obtain the first P consecutive symbols in the first data block that are stored in the storage unit, and determine the first iterative item of the second data block according to the first P consecutive symbols in the first data block and the formula H(a); or the storage unit is configured to store the first iterative item of the second data block; and the first determining unit is specifically configured to obtain the first iterative item that is of the second data block and is stored in the storage unit.

Optionally, in another embodiment, if the s parameter values corresponding to the first data block are the s values of the correction factor, and the s parameter values corresponding to the second data block are the s values of the correction factor, 1<s≤2×t, where t is a maximum quantity of error symbols that can be corrected in one FEC frame, and the first iterative item and the second iterative item each include s values.

The second determining unit is specifically configured to determine, according to the following formula, the s values of the correction factor corresponding to the second data block:

$$S_{current,i} = S_{previous,i} \times (\alpha_i)^P + H_1(\alpha_i) \times (\alpha_i)^N + H_2(\alpha_i) \quad 1 \le i \le s, \tag{25}$$

where $S_{current,i}$ is the $i^{th}$ value of the correction factor corresponding to the second data block, $S_{previous,i}$ is the $i^{th}$ value of the correction factor corresponding to the first data block, $H_1(\alpha_i)$ is the $i^{th}$ value of the first iterative item of the second data block, $H_2(\alpha_i)$ is the $i^{th}$ value of the second iterative item of the second data block, and $\alpha_i$ is the $i^{th}$ root of a generator polynomial of an FEC code.

Optionally, in another embodiment, if the s parameter values corresponding to the first data block are the s values of the verification factor, and the s parameter values corresponding to the second data block are the s values of the verification factor, s=1, and the second determining unit is specifically configured to determine, according to the following formula, a value of the verification factor corresponding to the second data block:

$$R_{current} = (R_{previous} \times x^P) \bmod g(x) + (H_1(x) \times x^P) \bmod g(x) + (H_2(x) \times x^P) \bmod g(x) \tag{26}$$

where $R_{current}$ is the value of the verification factor corresponding to the second data block, $R_{previous}$ is a value of the verification factor corresponding to the first data block, $H_1(x)$ is the first iterative item of the second data block, $H_2(x)$ is the second iterative item of the second data block, and g(x) is a generator polynomial of an FEC code.

Optionally, in another embodiment, the third determining unit is specifically configured to: if the s parameter values that are corresponding to the second data block and determined by the second determining unit are all 0, determine that the second symbol is a frame boundary of an FEC frame; or if at least one parameter value in the s parameter values that are corresponding to the second data block and determined by the second determining unit is not equal to 0, determine that the second symbol is not a frame boundary of an FEC frame.

Optionally, in another embodiment, the receiving unit is further configured to: if a quantity of symbols included in the data is less than 2N, receive new data, where the new data includes P consecutive symbols, the new data is adjacent to the N+P consecutive symbols and is received after the N+P consecutive symbols, N consecutive symbols with a third symbol in the second data block being a starting point constitute a third data block, and an offset of the third symbol relative to the second symbol is P symbols.

The second determining unit is further configured to: if the third determining unit determines that the second symbol is not a frame boundary of an FEC frame, determine a first iterative item and a second iterative item of the third data block, where the first iterative item of the third data block is obtained according to first P consecutive symbols in the second data block, and the second iterative item of the third data block is obtained according to the P consecutive symbols included in the new data; and determine, according to the s parameter values corresponding to the second data block and the first iterative item and the second iterative item of the third data block, s parameter values corresponding to the third data block.

The third determining unit is further configured to determine, according to the s parameter values that are corresponding to the third data block and determined by the second determining unit, whether the third symbol is a frame boundary of an FEC frame.

Optionally, in another embodiment, the receiving unit is further configured to: if a quantity of symbols included in the data is equal to 2N, receive new data, where the new data includes a fourth data block, the fourth data block is constituted by N consecutive symbols with a fourth symbol being a starting point, the new data is not adjacent to the N+P consecutive symbols and is received after the N+P consecutive symbols, an offset of a starting bit of the fourth symbol relative to a starting bit of the second symbol is L symbols, Lmodm≠0, or Lmodm=0 and LmodP≠0, mod indicates a modulo operation, and m is a quantity of bits included in one symbol.

The second determining unit is further configured to: if the third determining unit determines that the second symbol is not a frame boundary of an FEC frame, determine, according to the N consecutive symbols included in the fourth data block, s parameter values corresponding to the fourth data block.

The third determining unit is further configured to determine, according to the s parameter values that are corresponding to the fourth data block and determined by the second determining unit, whether the fourth symbol is a frame boundary of an FEC frame.

Therefore, according to the apparatus for determining a frame boundary of an FEC frame in this embodiment, s parameter values corresponding to a second data block are determined by using s parameter values corresponding to a first data block, where the first data block is constituted by N consecutive symbols with a first symbol being a starting point, the second data block is constituted by N consecutive symbols with a second symbol being a starting point, and an offset of the second symbol relative to the first symbol is P symbols; and a frame boundary determining circuit determines, according to the s parameter values corresponding to the second data block, whether the second symbol is a frame boundary of an FEC frame. For received 2N consecutive symbols, the frame boundary determining circuit can detect, by using an iterative algorithm, whether N/P symbols in the 2N consecutive symbols are a frame boundary of an FEC frame, thereby improving efficiency in determining a frame boundary of an FEC frame, increasing a synchronization speed of a communication link, and enhancing system performance.

It should be understood that, the term "and/or" in this embodiment describes only an association relationship for describing associated objects and represents that three relationships may exist. For example, A and/or B may represent the following three cases: Only A exists, both A and B exist, and only B exists. In addition, the character "/" in this specification generally indicates an "or" relationship between the associated objects.

A person of ordinary skill in the art may be aware that, in combination with the examples described in the embodiments disclosed in this specification, method steps and units may be implemented by electronic hardware, computer software, or a combination thereof. To clearly describe the interchangeability between the hardware and the software, the foregoing has generally described steps and compositions of each embodiment according to functions. Whether the functions are performed by hardware or software depends on particular applications and design constraint conditions of the technical solutions. A person of ordinary skill in the art may use different methods to implement the described functions for each particular application, but it shall not be considered that the implementation goes beyond the scope.

It may be clearly understood by a person skilled in the art that, for the purpose of convenient and brief description, for a detailed working process of the foregoing system, apparatus, and unit, refer to a corresponding process in the foregoing method embodiments, and details are not described herein again.

In the several embodiments provided in the present application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions essentially, or the part contributing to the prior art, or all or a part of the technical solutions may be implemented in the form of a software product. The software product is stored in a storage medium and includes several instructions for instructing a computer device (which may be a personal computer, a server, or a network device) to perform all or some of the steps of the methods described in the embodiments. The foregoing storage medium includes: any medium that can store program code, such as a universal serial bus (USB) flash drive, a removable hard disk, a read-only memory (ROM), a random access memory (RAM), a magnetic disk, or an optical disc.

The foregoing descriptions are merely specific embodiments, but are not intended to limit the protection scope. Any modification or replacement readily figured out by a person skilled in the aft within the technical scope disclosed in the present embodiments shall fall within the protection scope. Therefore, the protection scope of the present embodiments shall be subject to the protection scope of the claims.

What is claimed is:

1. A method comprising:
    receiving data, by a frame boundary determining circuit, wherein the data comprises N+P consecutive symbols having a first symbol as a starting point, wherein N is a quantity of symbols in a forward error correction (FEC) frame, N is a positive integer multiple of P, and N is greater than P, wherein a first data block comprises N consecutive symbols having a first starting point of the first symbol, wherein the first data block is in the N+P consecutive symbols, wherein a second data block comprises N consecutive symbols having a second starting point of a second symbol, wherein the second data block is in the N+P consecutive symbols, and wherein an offset of the second symbol relative to the first symbol is P symbols;
    obtaining s parameter values corresponding to the first data block;
    determining a first iterative item and a second iterative item of the second data block, wherein the first iterative item of the second data block is obtained according to first P consecutive symbols in the first data block, and the second iterative item of the second data block is obtained according to last P consecutive symbols in the second data block;
    determining, according to the s parameter values corresponding to the first data block, and the first iterative item and the second iterative item of the second data block, s parameter values corresponding to the second data block;
    determining, according to the s parameter values corresponding to the second data block, whether the second symbol is a frame boundary of an FEC frame; and
    in response to the determining that the second symbol is a frame boundary of the FEC frame, performing decoding.

2. The method according to claim 1, wherein the s parameter values corresponding to the first data block are s values of a correction factor, wherein the s parameter values corresponding to the second data block are s values of a correction factor, and wherein the first iterative item and the second iterative item of the second data block are determined using:

$$H(a) = \sum_{j=0}^{P-1} r(j) \times a^j,$$

wherein a is a constant, and r(j) indicates a $j^{th}$ symbol in the a first P consecutive symbols or the $j^{th}$ symbol in a last P consecutive symbols.

3. The method according to claim 2, wherein determining the first iterative item of the second data block comprises:
obtaining the first P consecutive symbols in the first data block from a first preset storage area; and
determining the first iterative item of the second data block according to the first P consecutive symbols in the first data block and H(a).

4. The method according to claim 2, wherein determining the first iterative item of the second data block comprises:
obtaining the first iterative item of the second data block from a second preset storage area.

5. The method according to claim 1, wherein the s parameter values corresponding to the first data block are s values of a verification factor, wherein the s parameter values corresponding to the second data block are s values of a verification factor, and wherein the first iterative item and the second iterative item of the second data block are determined using:

$$H(a) = \sum_{j=0}^{P-1} r(j) \times a^{n(j)},$$

wherein a is a variable, r(j) indicates a $j^{th}$ symbol in the first P consecutive symbols or the $j^{th}$ symbol in the last P consecutive symbols, and n(j) indicates a sequence number of the $j^{th}$ symbol.

6. The method according to claim 1, wherein $1 < s \leq 2 \times t$ in response to the s parameter values corresponding to the first data block being the s values of a correction factor and the s parameter values corresponding to the second data block being the s values of the correction factor, wherein t is a maximum quantity of error symbols that can be corrected in one FEC frame, and wherein the first iterative item and the second iterative item each comprise s values; and
the s values of the correction factor corresponding to the second data block are determined using:

$$S_{current,i} = S_{previous,i} \times (\alpha_i)^P + H_1(\alpha_i) \times (\alpha_i)^N + H_2(\alpha_i) \quad 1 \leq i \leq s,$$

wherein $S_{current,i}$ is an $i^{th}$ value of the correction factor corresponding to the second data block, $S_{previous,i}$ is an $i^{th}$ value of the correction factor corresponding to the first data block, $H_1(\alpha_i)$ is an $i^{th}$ value of the first iterative item of the second data block, $H_2(\alpha_i)$ is an $i^{th}$ value of the second iterative item of the second data block, and $\alpha_i$ is an $i^{th}$ root of a generator polynomial of an FEC code.

7. The method according to claim 1, wherein s=1 in response to the s parameter values corresponding to the first data block being the s values of a verification factor and the s parameter values corresponding to the second data block being the s values of the verification factor, and wherein a value of the verification factor corresponding to the second data block is determined using:

$$R_{current} = (R_{previous} \times x^P) \bmod g(x) + (H_1(x) \times x^P) \bmod g(x) + (H_2(x) \times x^P) \bmod g(x),$$

wherein $R_{current}$ is a value of the verification factor corresponding to the second data block, $R_{previous}$ is a value of the verification factor corresponding to the first data block, $H_1(x)$ is a first iterative item of the second data block, $H_2(x)$ is a second iterative item of the second data block, and g(x) is a generator polynomial of an FEC code.

8. The method according to claim 1, wherein determining, according to the s parameter values corresponding to the second data block, whether the second symbol is the frame boundary of an FEC frame comprises:
determining that the second symbol is the frame boundary of an FEC frame in response to the s parameter values corresponding to the second data block all equaling 0; and
determining that the second symbol is not the frame boundary of an FEC frame in response to at least one parameter value in the s parameter values corresponding to the second data block is not equaling 0.

9. The method according to claim 1, wherein the method further comprises:
receiving new data in response to a quantity of symbols in the data being less than 2N, wherein the new data comprises P consecutive symbols, the new data is adjacent to the N+P consecutive symbols, and the new data is received after the N+P consecutive symbols, wherein a third data block comprises N consecutive symbols having a third symbol as a starting point block, and wherein an offset of the third symbol relative to the second symbol is P symbols;
determining a first iterative item and a second iterative item of the third data block in response to determining that the second symbol is not a frame boundary of an FEC frame, wherein the first iterative item of the third data block is obtained according to first P consecutive symbols in the second data block, and wherein the second iterative item of the third data block is obtained according to the P consecutive symbols in the new data;
determining, according to the s parameter values corresponding to the second data block and the first iterative item and the second iterative item of the third data block, s parameter values corresponding to the third data block; and
determining, according to the s parameter values corresponding to the third data block, whether the third symbol is a frame boundary of an FEC frame.

10. The method according to claim 1, wherein the method further comprises:
receiving new data in response to a quantity of symbols in the data being equal to 2N, wherein the new data comprises a fourth data block, the fourth data block is comprises N consecutive symbols having a fourth starting point of a fourth symbol, wherein the new data is not adjacent to the N+P consecutive symbols and the new data is received after the N+P consecutive symbols, wherein an offset of a starting bit of the fourth symbol relative to a starting bit $n_1$ of the second symbol is L symbols, Lmodm≠0, or Lmodm=0 and LmodP≠0, mod indicates a modulo operation, and m is a quantity of bits comprised in one symbol;
determining, according to the N consecutive symbols in the fourth data block, s parameter values corresponding to the fourth data block, in response to determining that the second symbol is not a frame boundary of an FEC frame; and determining, according to the s parameter values corresponding to the fourth data block, whether the fourth symbol is a frame boundary of an FEC frame.

11. An apparatus comprising:

a receiver, configured to receive data, wherein the data comprises N+P consecutive symbols having a starting point of a first symbol, wherein N is a quantity of symbols in one forward error correction (FEC) frame, N is a positive integer multiple of P, and N is greater than P, wherein a first data block comprises N consecutive symbols having a first starting point of the first symbol, wherein the first symbol is in the N+P consecutive symbols, wherein a second data block comprises N consecutive symbols having a second starting point of a second symbol, wherein the second data block is in the N+P consecutive symbols, and wherein an offset of the second symbol relative to the first symbol is P symbols;

a parameter calculator coupled to the receiver, wherein the parameter calculator is configured to:
obtain s parameter values corresponding to the first data block received by the receiver;
determine a first iterative item and a second iterative item of the second data block received by the receiver; and
determine, according to the s parameter values corresponding to the first data block and the first iterative item and the second iterative item of the second data block, s parameter values corresponding to the second data block, wherein the first iterative item of the second data block is obtained according to first P consecutive symbols in the first data block, and the second iterative item of the second data block is obtained according to last P consecutive symbols in the second data block;

a comparator coupled to the parameter calculator, wherein the comparator is configured to determine, according to the s parameter values corresponding to the second data block and obtained by the parameter calculator, whether the second symbol is a frame boundary of an FEC frame; and a decoder coupled to the comparator, wherein the decoder is configured to perform decoding in response to determining that the second symbol is a frame boundary of the FEC frame.

12. The apparatus according to claim ii, wherein the s parameter values corresponding to the first data block are s values of a correction factor, wherein the s parameter values corresponding to the second data block are s values of a correction factor, and wherein the first iterative item and the second iterative item of the second data block are determined using:

$$H(a) = \sum_{j=0}^{P-1} r(j) \times a^j,$$

wherein a is a constant, and r(j) indicates a $j^{th}$ symbol in the first P consecutive symbols or a $j^{th}$ symbol in the last P consecutive symbols.

13. The apparatus according to claim 12, wherein the apparatus further comprises a memory coupled to the parameter calculator, wherein the memory is configured to store the first P consecutive symbols in the first data block, and the parameter calculator is specifically configured to:
obtain the first P consecutive symbols in the first data block stored in the memory, and
determine the first iterative item of the second data block according to the first P consecutive symbols in the first data block and H(a); or
wherein the memory is configured to store the first iterative item of the second data block, and the parameter calculator is configured to obtain the first iterative item of the second data block stored in the memory.

14. The apparatus according to claim 11, wherein the s parameter values corresponding to the first data block are s values of a verification factor, the s parameter values corresponding to the second data block are s values of a verification factor, and the first iterative item and the second iterative item of the second data block are determined using:

$$H(a) = \sum_{j=0}^{P-1} r(j) \times a^{n(j)},$$

wherein a is a variable, r(j) indicates a $j^{th}$ symbol in the first P consecutive symbols or a $j^{th}$ symbol in the last P consecutive symbols, and n(j) indicates a sequence number of the $j^{th}$ symbol.

15. The apparatus according to claim 11, wherein $1 \leq s \leq 2 \times t$ in response to the s parameter values corresponding to the first data block being the s values of a correction factor and the s parameter values corresponding to the second data block being the s values of the correction factor, wherein t is a maximum quantity of error symbols that can be corrected in one FEC frame, and wherein the first iterative item and the second iterative item each comprise s values; and
wherein the parameter calculator is specifically configured to determine s values of the correction factor corresponding to the second data block according to:

$$S_{current,i} = S_{previous,i} \times (\alpha_i)^P + H_1(\alpha_i) \times (\alpha_i)^N + H_2(\alpha_i)$$
$$1 \leq i \leq s,$$

wherein $S_{current,i}$ is an $i^{th}$ value of the correction factor corresponding to the second data block, $S_{previous,i}$ is an $i^{th}$ value of the correction factor corresponding to the first data block, $H_1(\alpha_i)$ is an $i^{th}$ value of the first iterative item of the second data block, $H_2(\alpha_i)$ is an $i^{th}$ value of the second iterative item of the second data block, and $\alpha_i$ is an $i^{th}$ root of a generator polynomial of an FEC code.

16. The apparatus according to claim ii, wherein s=1 in response to the s parameter values corresponding to the first data block being the s values of a verification factor and the s parameter values corresponding to the second data block being the s values of the verification factor, and wherein the parameter calculator is configured to determine a value of the verification factor corresponding to the second data block according to:

$$R_{current} = (R_{previous} \times x^P) \bmod g(x) + (H_1(x) \times x^P) \bmod g(x) + (H_2(x) \times x^P) \bmod g(x),$$

wherein $R_{current}$ is a value of the verification factor corresponding to the second data block, $R_{previous}$ is a value of the verification factor corresponding to the first data block, $H_1(x)$ is the first iterative item of the second data block, $H_2(x)$ is the second iterative item of the second data block, and g(x) is a generator polynomial of an FEC code.

17. The apparatus according to claim 11, wherein the comparator is configured to:

determine that the second symbol is a frame boundary of an FEC frame in response to the s parameter values corresponding to the second data block and determined by the parameter calculator all equaling 0; and determine that the second symbol is not a frame boundary of an FEC frame in response to at least one parameter value in the s parameter values corresponding to the second data block and determined by the parameter calculator not equaling 0.

18. The apparatus according to claim 11, wherein the receiver is further configured to receive new data in response to a quantity of symbols in the data being less than 2N:

wherein the new data comprises P consecutive symbols, the new data is adjacent to the N+P consecutive symbols, and the new data is received after the N+P consecutive symbols, wherein a third data block comprises N consecutive symbols having a third starting point of a third symbol in the second data block, and wherein an offset of the third symbol relative to the second symbol is P symbols;

wherein the parameter calculator is further configured to:
determine a first iterative item and a second iterative item of the third data block in response to the comparator determining that the second symbol is not a frame boundary of an FEC frame, wherein the first iterative item of the third data block is obtained according to first P consecutive symbols in the second data block, and the second iterative item of the third data block is obtained according to the P consecutive symbols comprised in the new data; and determine, according to the s parameter values corresponding to the second data block and the first iterative item and the second iterative item of the third data block, s parameter values corresponding to the third data block; and wherein the comparator is further configured to determine, according to the s parameter values corresponding to the third data block and determined by the parameter calculator, whether the third symbol is a frame boundary of an FEC frame.

19. The apparatus according to claim ii, wherein the receiver is further configured to receive new data in response to a quantity of symbols in the data being equal to 2N, wherein the new data comprises a fourth data block, wherein the fourth data block comprises N consecutive symbols having a fourth starting point of a fourth symbol, wherein the new data is not adjacent to the N+P consecutive symbols and is received after the N+P consecutive symbols, wherein an offset of a fourth starting bit of the fourth symbol relative to a starting bit of the second symbol is L symbols, Lmodm≠0, or Lmodm=0 and LmodP≠0, mod indicates a modulo operation, and m is a quantity of bits comprised in one symbol;

wherein the parameter calculator is further configured to determine, according to the N consecutive symbols comprised in the fourth data block, s parameter values corresponding to the fourth data block, in response to the comparator determining that the second symbol is not a frame boundary of an FEC frame; and the comparator is further configured to determine, according to the s parameter values corresponding to the fourth data block and determined by the parameter calculator, whether the fourth symbol is a frame boundary of an FEC frame.

20. A decoding system, comprising:

a frame boundary determining circuit configured to determine a frame boundary of a forward error correction (FEC) code;

an error diagnosis device coupled to the frame boundary determining circuit, wherein the error diagnosis device is configured to determine, according to the frame boundary determined by the frame boundary determining circuit, an error that exists in an FEC frame; and an error correction device coupled to the error diagnosis device, wherein the error correction device is configured to perform error correction on the FEC frame according to the error in the FEC frame and determined by the error diagnosis device, and wherein the frame boundary determining circuit is configured to:

receive data, wherein the data comprises N+P consecutive symbols with a first symbol being a starting point, wherein N is a quantity of symbols comprised in one FEC frame, N is a positive integer multiple of P, and N is greater than P, wherein a first data block comprises N consecutive symbols having a first starting point of the first symbol, wherein the first data block is in the N+P consecutive symbols , wherein a second data block comprises N consecutive symbols having a second starting point of a second symbol, wherein the second data block is in the N+P consecutive symbols, and wherein an offset of the second symbol relative to the first symbol is P symbols;

obtain s parameter values corresponding to the first data block;

determine a first iterative item and a second iterative item of the second data block, wherein the first iterative item of the second data block is obtained according to first P consecutive symbols in the first data block, and the second iterative item of the second data block is obtained according to last P consecutive symbols in the second data block;

determine, according to the s parameter values corresponding to the first data block and the first iterative item and the second iterative item of the second data block, s parameter values corresponding to the second data block; and determine, according to the s parameter values corresponding to the second data block, whether the second symbol is a frame boundary of an FEC frame, wherein decoding is performed in response to determining that the second symbol is a frame boundary of an FEC frame.

* * * * *

UNITED STATES PATENT AND TRADEMARK OFFICE
CERTIFICATE OF CORRECTION

PATENT NO. : 10,116,419 B2
APPLICATION NO. : 15/411669
DATED : October 30, 2018
INVENTOR(S) : Yuchun Lu et al.

It is certified that error appears in the above-identified patent and that said Letters Patent is hereby corrected as shown below:

In the Claims

In Column 39, Line 50, Claim 12, delete "claim ii" and insert --claim 11--.

In Column 40, Line 50, Claim 16, delete "claim ii" and insert --claim 11--.

In Column 41, Line 41, Claim 19, delete "claim ii" and insert --claim 11--.

Signed and Sealed this
Thirtieth Day of April, 2019

Andrei Iancu
*Director of the United States Patent and Trademark Office*